(12) United States Patent
Shin et al.

(10) Patent No.: US 11,762,007 B2
(45) Date of Patent: Sep. 19, 2023

(54) MULTI-CORE CABLE FAULT CLASSIFICATION SYSTEM AND METHOD

(71) Applicant: Industry-Academic Cooperation Foundation, Yonsei University, Seoul (KR)

(72) Inventors: Yong-June Shin, Seoul (KR); Su Sik Bang, Seoul (KR)

(73) Assignee: INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 365 days.

(21) Appl. No.: 16/999,272

(22) Filed: Aug. 21, 2020

(65) Prior Publication Data

US 2021/0080497 A1 Mar. 18, 2021

(30) Foreign Application Priority Data

Aug. 21, 2019 (KR) ........................ 10-2019-0102640

(51) Int. Cl.
*G01R 31/08* (2020.01)
*G01R 31/60* (2020.01)
(Continued)

(52) U.S. Cl.
CPC ............ *G01R 31/088* (2013.01); *G01R 31/11* (2013.01); *G01R 31/60* (2020.01); *G06N 3/08* (2013.01);
(Continued)

(58) Field of Classification Search
CPC ...... G01R 31/088; G01R 31/11; G01R 31/60; G01R 31/08; G01R 31/58; G01R 31/50;
(Continued)

(56) References Cited

U.S. PATENT DOCUMENTS 4,651,084 A 3/1987 Welsh et al.
2004/0230387 A1* 11/2004 Bechhoefer ............ G01R 31/11
702/58
(Continued)

FOREIGN PATENT DOCUMENTS

EP 1477820 A2 * 11/2004 ............ G01R 31/11
KR 101213195 B1 * 12/2012
(Continued)

OTHER PUBLICATIONS

C.-K. Lee and Y.-J. Shin, "Multi-core cable fault diagnosis using cluster time-frequency domain reflectometry," 2018 IEEE International Instrumentation and Measurement Technology Conference (I2MTC), 2018, pp. 1-6, doi: 10.1109/I2MTC.2018.8409561. (Year: 2018).*

(Continued)

*Primary Examiner* — Rebecca C Bryant
*Assistant Examiner* — Christopher J Gassen
(74) *Attorney, Agent, or Firm* — Paratus Law Group, PLLC

(57) ABSTRACT

Disclosed is a multi-core cable fault classification system which includes a reference signal measurement unit configured to measure a core-specific reference signal generated by applying an electromagnetic signal to a multi-core cable having at least two cores, a reflected-signal measurement unit configured to measure a core-specific reflected signal generated by reflecting the generated core-specific reference signal at a point of the multi-core cable, a data processing unit configured to extract, from time-series data for the measured core-specific reflected signal, core-specific partial time-series data based on whether baseline data of the multi-core cable is present, configured to transform the core-specific partial time-series data into a time-frequency distribution, and configured to extract faulty-core determi- (Continued)

nation data, and a faulty core classification unit configured to classify a fault core from the multi-core cable by inputting the extracted faulty-core determination data to a neural network.

14 Claims, 13 Drawing Sheets

(51) Int. Cl.
    *G01R 31/11*         (2006.01)
    *G06N 3/08*          (2023.01)
    *G06T 7/64*          (2017.01)
    *G06T 5/50*          (2006.01)
    *G06T 7/00*          (2017.01)

(52) U.S. Cl.
    CPC .............. *G06T 5/50* (2013.01); *G06T 7/0002* (2013.01); *G06T 7/64* (2017.01); *G06T 2207/20221* (2013.01)

(58) Field of Classification Search
    CPC . G06N 3/08; G06N 20/00; G06T 5/50; G06T 7/0002; G06T 7/64; G06T 2207/20221
    See application file for complete search history.

(56) References Cited

U.S. PATENT DOCUMENTS

| | | | | |
|---|---|---|---|---|
| 2006/0097730 A1* | 5/2006 | Park | ....................... | G01R 31/11 324/534 |
| 2012/0186349 A1* | 7/2012 | Inoue | ..................... | G01N 29/46 73/600 |
| 2017/0180549 A1* | 6/2017 | Zahedi | ................ | H04L 41/0677 |
| 2020/0049755 A1* | 2/2020 | Cabanillas | ............. | G01R 31/11 |

FOREIGN PATENT DOCUMENTS

| | | | | |
|---|---|---|---|---|
| KR | 20130031106 A | * | 3/2013 | |
| KR | 101886808 B1 | * | 8/2018 | |
| WO | WO-2018079912 A1 | * | 5/2018 | ............. G01R 23/16 |

OTHER PUBLICATIONS

M.-F. Guo, N.-C. Yang and W.-F. Chen, "Deep-Learning-Based Fault Classification Using Hilbert-Huang Transform and Convolutional Neural Network in Power Distribution Systems," in IEEE Sensors Journal, vol. 19, No. 16, pp. 6905-6913, 15 Aug. 15, 2019, doi: 10.1109/JSEN.2019.2913006. (Year: 2019).*

Sun, Hequan & Wang, YX & Peng, JP. (2002). Hilbert transform applied to separation of waves. China Ocean Engineering. 16. 239-248. (Year: 2002).*

Y. .-J. Shin et al., "Application of time-frequency domain reflectometry for detection and localization of a fault on a coaxial cable," in IEEE Transactions on Instrumentation and Measurement, vol. 54, No. 6, pp. 2493-2500, Dec. 2005, doi: 10.1109/TIM.2005.858115. (Year: 2005).*

C. K. Lee, K. S. Kwak, T. S. Yoon and J. B. Park, "Cable Fault Localization Using Instantaneous Frequency Estimation in Gaussian-Enveloped Linear Chirp Reflectometry," in IEEE Transactions on Instrumentation and Measurement, vol. 62, No. 1, pp. 129-139, Jan. 2013, doi: 10.1109/TIM.2012.2212514. (Year: 2013).*

Bechhoefer E R, EP-1477820-A2 Translation, Nov. 2004 (Year: 2004).*

Park J B, KR-101213195-B1 Translation, Dec. 2012 (Year: 2012).*

Park J B, KR 20130031106 A Translation, Mar. 2013 (Year: 2013).*

Bang S, WO-2018079912-A1 Translation, May 2018 (Year: 2018).*

Shin Y J. KR-101886808-B1 Translation, Aug. 2018 (Year: 2018).*

Su Sik Bang et al., "Classification of Faults in Multicore Cable via Time-Frequency Domain Reflectometry", IEEE Transactions on Industrial Electronics, Jun. 7, 2019, vol. 67, No. 5, pp. 4163-4171.

\* cited by examiner

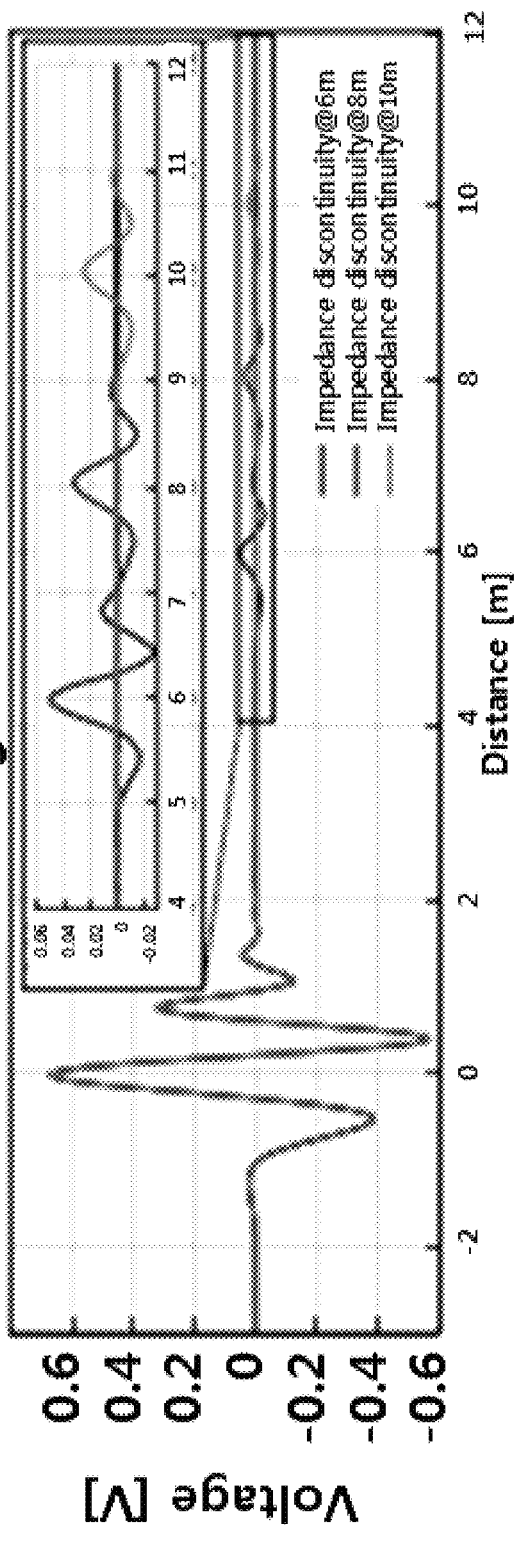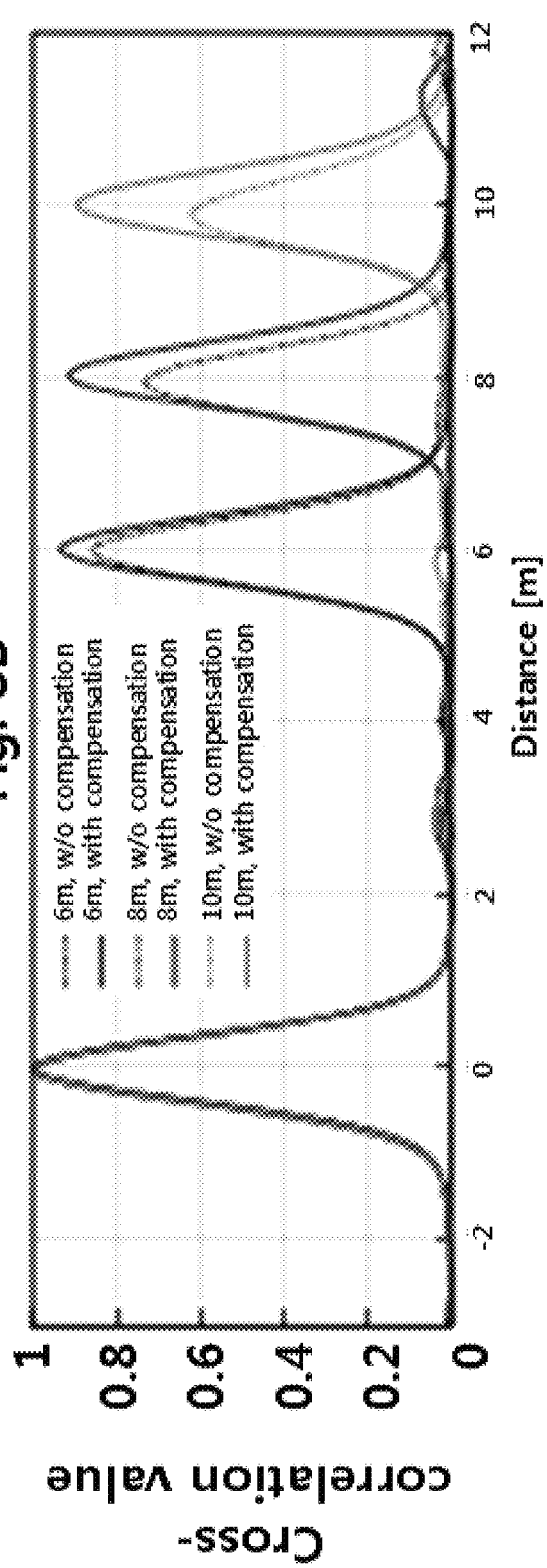
Fig. 8A
Fig. 8B

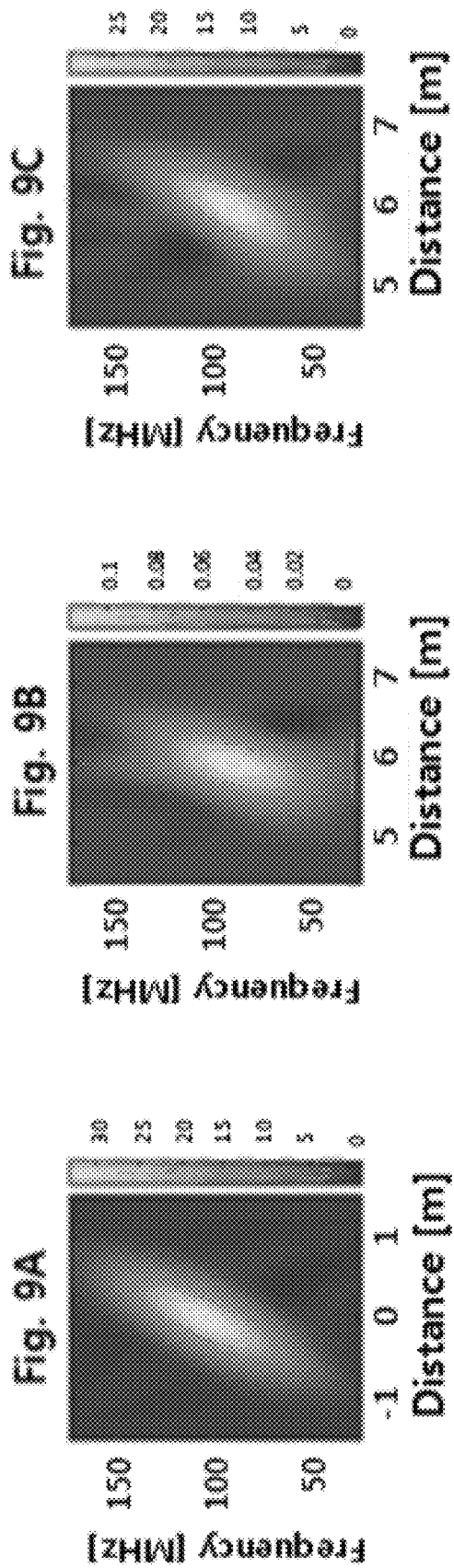
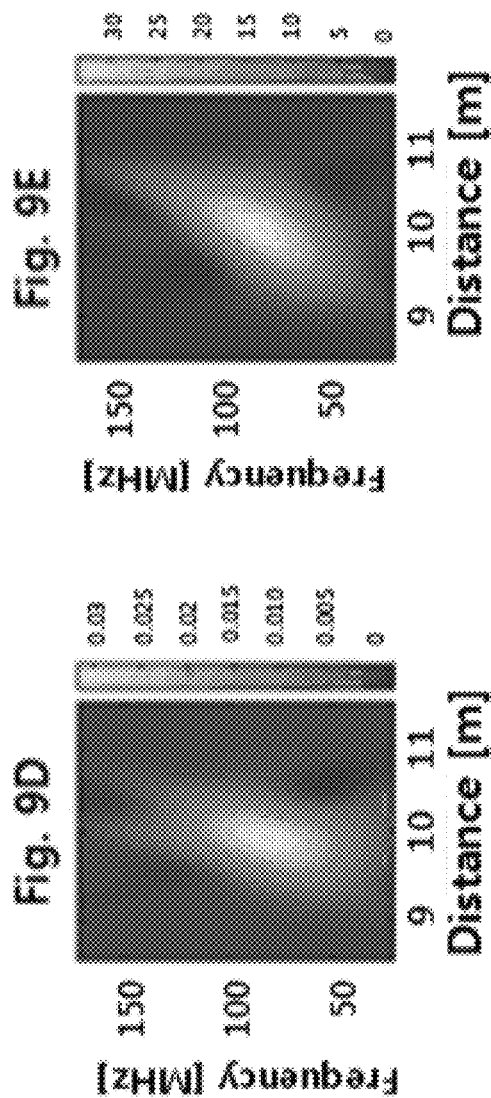

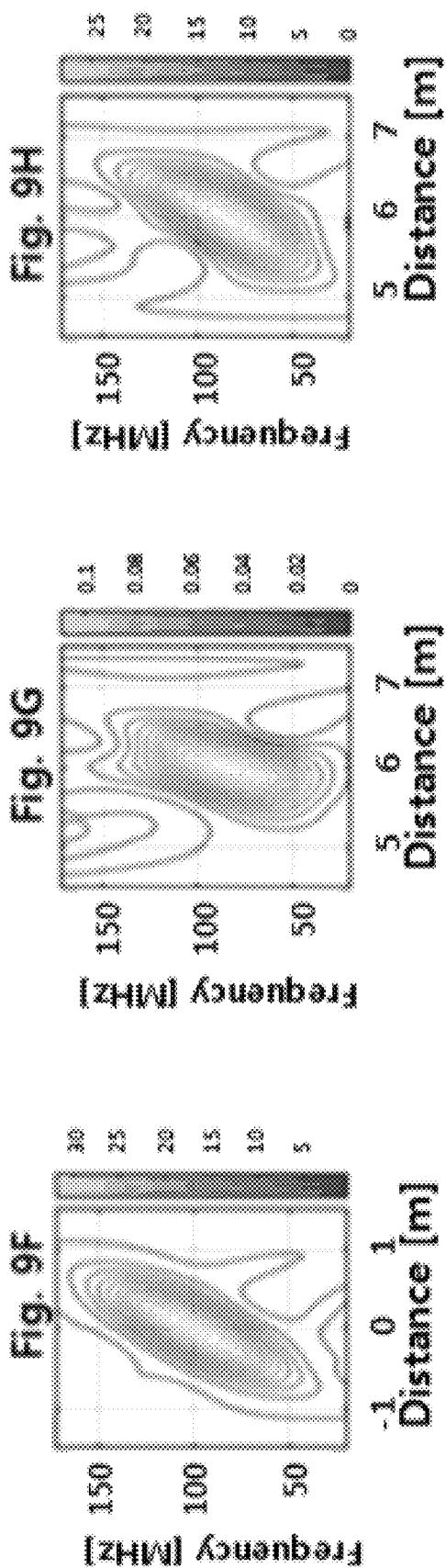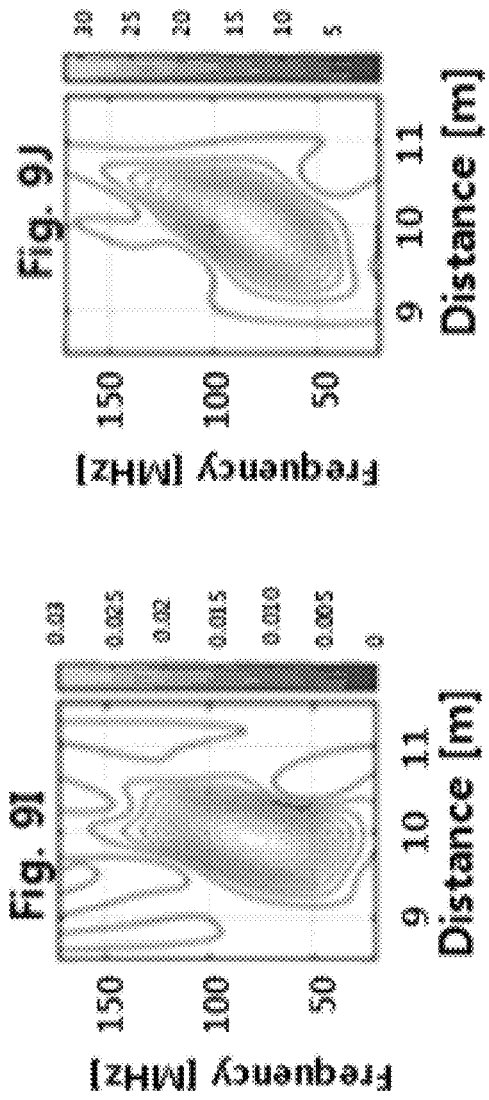

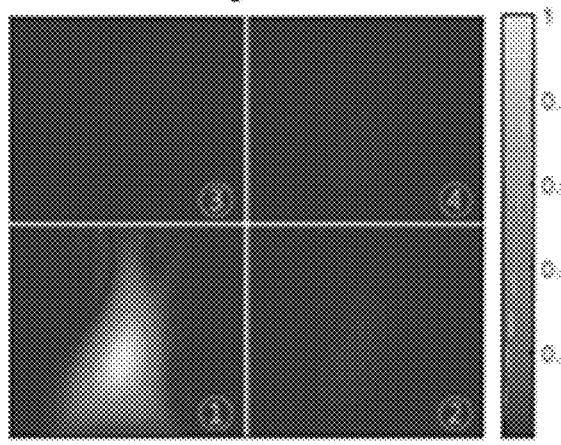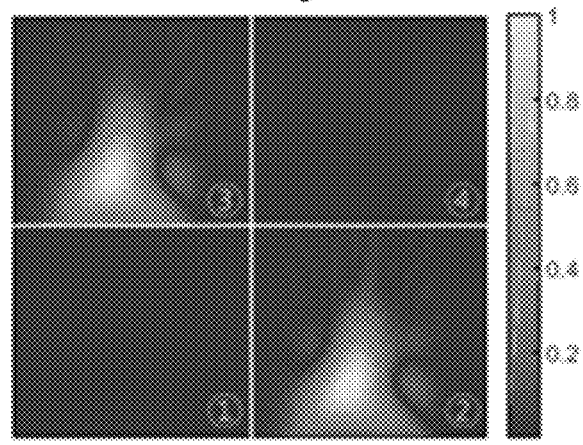

MULTI-CORE CABLE FAULT CLASSIFICATION SYSTEM AND METHOD

CROSS-REFERENCE TO PRIOR APPLICATION

This application claims priority to Korean Patent Application No. 10-2019-0102640 (filed on Aug. 21, 2019), which is hereby incorporated by reference in its entirety.

BACKGROUND

The present invention relates to cable fault classification, and more particularly, a multi-core cable fault classification system and method for determining which core has a fault in a multi-core cable using the time-frequency domain reflectometry (TFDR) and classifying the faulty core.

As the use of multi-core cables (network cables, control and measurement cables, etc.) increases due to industrial advancement, a technique is required not only to estimate where a fault is located in a multi-core cable but also to determine which core has a problem.

In the case of a reflectometry used to determine a cable fault, generally, it is possible to estimate the position of the fault or determine which core has a problem in a multi-core cable, but this method has a limitation in that measurement and judgment must be carried out by a person.

Thus, for a technique of determining and classifying a faulty core in a multi-core cable, there is a need to develop a technique for automatically determining and classifying which core of the cable has a problem at which position of the cable.

SUMMARY

Accordingly, the present invention has been proposed in consideration of the above matters and is directed to automating fault classification for a multi-core cable through computer-based machine learning, artificial neural networks, and the like.

Also, the present invention is directed to automatically determining and classifying which core of a multi-core cable has a fault.

Also, the present invention is directed to implementing a fault determination and classification technique through image processing regardless of the presence or absence of the baseline data of the multi-core cable, that is, data measured when no fault exists.

Also, the present invention is directed to increasing the accuracy of the fault determination and classification by compensating for a distortion of a reflected signal corresponding to a propagation distance.

Also, the present invention is directed to increasing the accuracy of the fault determination and classification by deriving clear features (a point, a line, an area, etc.) that a computer can perceive.

Also, the present invention is directed to increasing the efficiency of fault measurement by adjusting the numbers and positions of cores to which (+) polarity and (−) polarity are applied.

The present invention is not limited to the above objectives, and other objectives not described herein may be clearly understood by those skilled in the art from descriptions below.

According to an aspect of the present invention, there is provided a multi-core cable fault classification system including a reference signal measurement unit configured to measure a core-specific reference signal generated by applying an electromagnetic signal to a multi-core cable having at least two cores, a reflected-signal measurement unit configured to measure a core-specific reflected signal generated by reflecting the generated core-specific reference signal at a point of the multi-core cable, a data processing unit configured to extract, from time-series data for the measured core-specific reflected signal, core-specific partial time-series data based on whether baseline data of the multi-core cable is present, configured to transform the core-specific partial time-series data into a time-frequency distribution, and configured to extract faulty-core determination data, and a faulty core classification unit configured to classify a fault core from the multi-core cable by inputting the extracted faulty-core determination data to a neural network.

In this case, the baseline data of the multi-core cable may be data regarding a reflected signal measured when no fault exists in the multi-core cable.

When the baseline data of the multi-core cable is not present, the data processing unit may include a reflected-signal compensation unit configured to compensate for the measured core-specific reflected signal on the basis of experimental data of the multi-core cable, a first time-frequency distribution transform unit configured to extract core-specific partial time-series data corresponding to the reflected signal for which compensation is made and configured to transform the partial time-series data into a core-specific time-frequency distribution, a first normalization unit configured to normalize the core-specific time-frequency distribution, and a distortion correction unit configured to correct a distortion of the normalized core-specific time-frequency distribution.

The reflected-signal compensation unit may compensate for the measured core-specific reflected signal on the basis of experimental data using a signal distortion degree calculation formula expressed in Equation 1 below:

$$\zeta(t) = \frac{|H(S_r(t))|}{|H(S_o(t))|} \qquad \text{[Equation 1]}$$

where $\zeta(t)$ is an attenuation rate in time series, H is a Hilbert transform, r is a reflected signal, o is a reference signal, $S_r(t)$ is a reflected signal in time series, $S_o(t)$ is a reference signal in time series, $H(S_r(t))$ is a Hilbert transform of the reflected signal, and $H(S_o(t))$ is a Hilbert transform of the reference signal.

The distortion correction unit may include a shift unit configured to apply a column shift to the normalized core-specific time-frequency distribution to move the core-specific time-frequency distribution, a rotation unit configured to estimate a slope of the moved core-specific time-frequency distribution through principal component analysis (PCA) and configured to rotate the core-specific time-frequency distribution on the basis of the estimated slope, a contour extraction unit configured to extract a core-specific contour from the rotated core-specific time-frequency distribution, an image merging unit configured to merge time-frequency distributions including extracted core-specific contours into one image, and a first faulty-core determination data extraction unit configured to extract faulty-core determination data from information regarding at least one of a point, a line, and an area in which the core-specific contours overlap each other through the image.

The rotation unit may rotate the moved core-specific time-frequency distribution using a rotation angle calculation formula expressed in Equation 2 below:

$$\theta_i = \frac{\pi}{N}(i-1) \qquad \text{[Equation 2]}$$

where $\theta_i$ is an angle by which an $i^{th}$ core should be rotated, N is the number of cores in the multi-core cable, and i is a core number of a core to be rotated.

The contour extraction unit may extract a contour from the rotated core-specific time-frequency distribution using a contour extraction formula expressed in Equation 3 below:

$$I_{new}(m,n) = e^{-a|I_{old}(m,n)-\sigma|} \qquad \text{[Equation 3]}$$

where $I_{new}(m,n)$ is a new image (a contour image), $I_{old}(m,n)$ is an old image (an image before a contour is extracted), m and n are a row number and a column number in a time-frequency distribution image, a is a parameter value for determining the thickness of a contour, and σ is a parameter value for determining the area of an ellipse.

When the baseline data of the multi-core cable is present, the data processing unit may include a second time-frequency distribution transform unit configured to compare the measured core-specific reflected signal and the baseline data of the multi-core cable, extract core-specific partial time-series data having a difference therebetween, and then transform the partial time-series data into a core-specific time-frequency distribution, a second normalization unit configured to arrange core-specific time-frequency distributions as one image and then normalize the image on the basis of a core-specific time-frequency distribution having the largest value, and a second faulty-core determination data extraction unit configured to perform max-pooling on the normalized image to extract faulty-core determination data.

According to another aspect of the present invention, there is provided a multi-core cable fault classification method including a reference signal measurement operation in which a reference signal measurement unit measures a core-specific reference signal generated by applying an electromagnetic signal to a multi-core cable having at least two cores, a reflected-signal measurement operation in which a reflected-signal measurement unit measures a core-specific reflected signal generated by reflecting the generated core-specific reference signal at a point of the multi-core cable, a data processing operation in which a data processing unit extracts, from time-series data for the measured core-specific reflected signal, core-specific partial time-series data based on whether baseline data of the multi-core cable is present, transforms the core-specific partial time-series data into a time-frequency distribution, and extracts faulty-core determination data, and a faulty core classification operation in which a faulty core classification unit classifies a fault core from the multi-core cable by inputting the extracted faulty-core determination data to a neural network.

The baseline data of the multi-core cable may be data regarding a reflected signal measured when no fault exists in the multi-core cable.

When the baseline data of the multi-core cable is not present, the data processing operation may include a reflected-signal compensation operation in which a reflected-signal compensation unit compensates for the measured core-specific reflected signal on the basis of experimental data of the multi-core cable, a first time-frequency distribution transform operation in which a first time-frequency distribution transform unit extracts core-specific partial time-series data corresponding to the reflected signal for which compensation is made and transforms the core-specific partial time-series data into a core-specific time-frequency distribution, a first normalization operation in which a first normalization unit normalizes the core-specific time-frequency distribution, and a distortion correction operation in which a distortion correction unit corrects a distortion of the normalized core-specific time-frequency distribution.

The reflected-signal compensation operation may include compensating for the measured core-specific reflected signal on the basis of experimental data using a signal distortion degree calculation formula expressed in Equation 1 below:

$$\zeta(t) = \frac{|H(S_r(t))|}{|H(S_o(t))|} \qquad \text{[Equation 1]}$$

where $\zeta(t)$ is an attenuation rate value in time series, H is a Hilbert transform value, r is a reflected signal value, o is a reference signal value, $S_r(t)$ is a reflected signal value in time series, $S_o(t)$, is a reference signal value in time series, $H(S_r(t))$ is a Hilbert transform value of the reflected signal, and $H(S_o(t))$ is a Hilbert transform value of the reference signal.

The distortion correction operation may include a shift operation in which a shift unit applies a column shift to the normalized core-specific time-frequency distribution to move the core-specific time-frequency distribution, a rotation operation in which a rotation unit estimates a slope of the moved core-specific time-frequency distribution through principal component analysis (PCA) and rotates the core-specific time-frequency distribution on the basis of the estimated slope, a contour extraction operation in which a contour extraction unit extracts a core-specific contour from the rotated core-specific time-frequency distribution, an image merging operation in which an image merging unit merges time-frequency distributions including extracted core-specific contours into one image, and a first faulty-core determination data extraction operation in which a first faulty-core determination data extraction unit extracts faulty-core determination data from information regarding at least one of a point, a line, and an area in which the core-specific contours overlap each other through the image.

The rotation operation may include rotating the moved core-specific time-frequency distribution using a rotation angle calculation formula expressed in Equation 2 below:

$$\theta_i = \frac{\pi}{N}(i-1) \qquad \text{[Equation 2]}$$

where $\theta_i$ is an angle by which an $i^{th}$ core should be rotated, N is the number of cores in the multi-core cable, and i is a core number of a core to be rotated.

The contour extraction operation may include extracting a contour from the rotated core-specific time-frequency distribution using a contour extraction formula expressed in Equation 3 below:

$$I_{new}(m,n) = e^{-a|I_{old}(m,n)-\sigma|} \qquad \text{[Equation 3]}$$

where $I_{new}(m,n)$ is a new image (a contour image), $I_{old}(m,n)$ is an old image (an image before a contour is extracted), m and n are a row number and a column number in a time-frequency distribution image, a is a parameter value for determining the thickness of a contour, and σ is a parameter value for determining the area of an ellipse.

When the baseline data of the multi-core cable is present, the data processing operation may include a second time-frequency distribution transform operation in which a second time-frequency distribution transform unit compares the measured core-specific reflected signal and the baseline data of the multi-core cable, extracts core-specific partial time-series data having a difference therebetween, and then transforms the core-specific partial time-series data into a core-specific time-frequency distribution, a second normalization operation in which a second normalization unit arranges core-specific time-frequency distributions as one image and then normalizes the image on the basis of a core-specific time-frequency distribution having the largest value, and a second faulty-core determination data extraction operation in which a second faulty-core determination data extraction unit performs max-pooling on the normalized image to extract faulty-core determination data.

BRIEF DESCRIPTION OF THE DRAWINGS

FIGS. 8A and 8B are diagrams showing a reflected-signal compensation result according to an embodiment of the present invention.

FIGS. 9A to 9J are time-frequency distributions of a GELC signal designed with a center frequency of 100 MHz, a frequency bandwidth of 180 MHz, and a time duration of 25 ns according to an embodiment of the present invention.

FIGS. 12A and 12B are diagrams showing image processing of time-frequency distributions when the baseline data of a multi-core cable is present according to an embodiment of the present invention.

DETAILED DESCRIPTION

For better understanding of the invention, its operating advantages and the specific objects attained by its uses, reference should be made to the accompanying drawings and descriptive matter in which preferred embodiments of the invention are illustrated. Features and advantages of the present invention will become apparent from the following detailed description based on the accompanying drawings. Terms and words used in the present specification and claims should be interpreted as having meanings and concepts relevant to the technical spirit of the present invention on the basis of the rule that an inventor can appropriately define concepts of terms so as to explain his or her invention in the best way. Moreover, it should be noted that detailed descriptions about well-known functions or configurations associated with the present invention will be ruled out in order not to unnecessarily obscure subject matters of the present invention.

Figure 1:
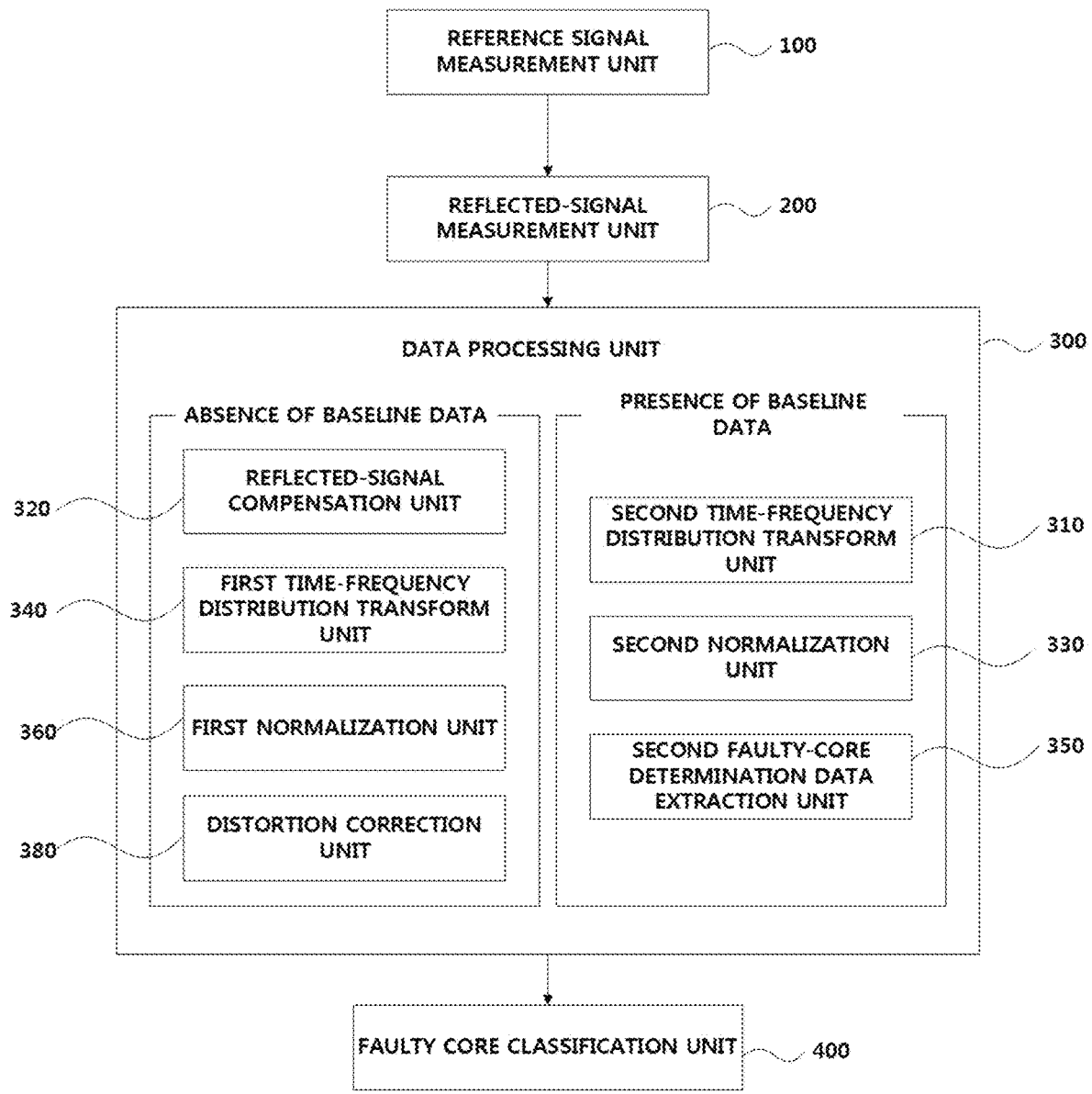
FIG. 1 is a block diagram showing a multi-core cable fault classification system according to an embodiment of the present invention.
Figure 2:
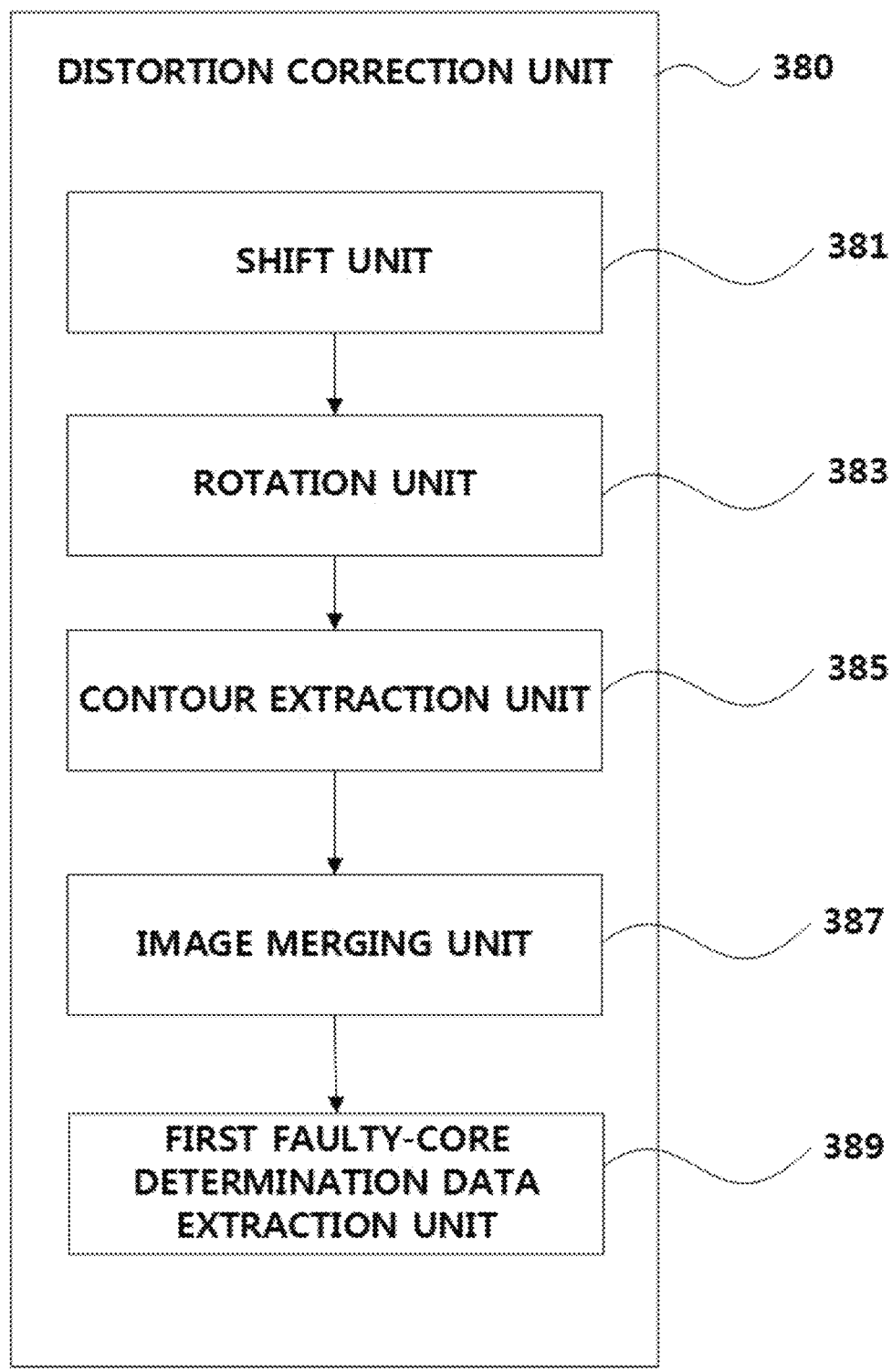
FIG. 2 is a diagram showing a distortion correction unit 380 of FIG. 1.

FIG. 1 is a block diagram showing a multi-core cable fault classification system according to an embodiment of the present invention, and FIG. 2 is a diagram showing a distortion correction unit 380 of FIG. 1.

First, referring to FIG. 1, the multi-core cable fault classification system according to an embodiment of the present invention may include a reference signal measurement unit 100, a reflected-signal measurement unit 200, a data processing unit 300, and a faulty core classification unit 400.

The reference signal measurement unit 100 may measure a core-specific reference signal which is generated by applying an electromagnetic signal to a multi-core cable having at least two or more cores. The reference signal measurement unit 100 may be a component for measuring a reference signal, which is one piece of signal data used to determine and classify a faulty core of the multi-core cable.

The reflected-signal measurement unit 200 may measure a core-specific reflected signal which is generated by reflecting the reference signal generated by applying the electromagnetic signal at any point of the multi-core cable. The reflected-signal measurement unit 200 may be a component for measuring a reflected signal, which is one piece of signal data used to determine and classify a faulty core of the multi-core cable.

The data processing unit 300 may extract core-specific partial time-series data from time-series data for the core-specific reflected signal measured by the reflected-signal measurement unit 200. Also, the data processing unit 300 may transform the core-specific partial time-series data into a time-frequency distribution to extract faulty-core determination data.

In this case, the data processing unit 300 may extract core-specific partial time-series data on the basis of whether the baseline data of the multi-core cable is present, transform the core-specific partial time-series data into a time-frequency distribution, and determine a fault core.

The baseline data of the multi-core cable may be data regarding a reflected signal measured when no fault exists in the multi-core cable. That is, the baseline data of the multi-core cable may be data regarding a reflected signal generated by reflecting the reference signal generated by applying the electronic magnetic signal to the multi-core cable at any point of the cable when no fault exists in the corresponding cable.

More specifically, the data processing unit 300 may include a second time-frequency distribution transform unit 310, a reflected-signal compensation unit 320, a second normalization unit 330, a first time-frequency distribution transform unit 340, a second faulty-core determination data extraction unit 350, a first normalization unit 360, and a distortion correction unit 380 and may operate differently depending on whether the baseline data of the multi-core cable is present or not.

When the baseline data of the multi-core cable is not present, the data processing unit 300 may include the reflected-signal compensation unit 320, the first time-frequency distribution transform unit 340, the first normalization unit 360, and the distortion correction unit 380.

The reflected-signal compensation unit 320 may compensate for the core-specific reflected signal measured by the reflected-signal measurement unit 200 on the basis of experimental data of the multi-core cable. The reflected-signal compensation unit 320 may be a component for compensating for the reflected signal in order to complement a problem of a reflectometry in which a signal is distorted according to a traveled distance.

In this case, the experimental data is data obtained through a pre-experiment and may be data obtained by measuring the degree of distortion of a reference signal in the time-frequency domain reflectometry (TFDR), i.e., an attenuation characteristic. The reflected-signal compensation unit 320 may compensate for the distortion of the reflected signal on the basis of the experimental data to restore the reflected signal.

The reflected-signal compensation unit 320 may compensate for the core-specific reflected signal measured by the reflected-signal measurement unit 200 on the basis of the experimental data using a signal distortion degree calculation formula expressed in Equation 1 below:

$$\zeta(t) = \frac{|H(S_r(t))|}{|H(S_o(t))|} \quad \text{[Equation 1]}$$

where $\zeta(t)$ is an attenuation rate value in time series, H is a Hilbert transform value, r is a reflected signal value, o is a reference signal value, $S_r(t)$ is a reflected signal value in time series, $S_o(t)$ is a reference signal value in time series, $H(S_r(t))$ is a Hilbert transform value of the reflected signal, $H(S_o(t))$ and is a Hilbert transform value of the reference signal.

The first time-frequency distribution transform unit 340 may extract core-specific partial time-series data corresponding to the reflected signal for which compensation is made by the reflected-signal compensation unit 320 and then may transform the core-specific partial time-series data into a time-frequency distribution. The first time-frequency distribution transform unit 340 may be a component for extracting and transforming only factor data necessary to determine a failure using a fact that in the entire time-series data of the signal, a reflected signal returned from a faulty core is distinguished from a reflected signal returned from a normal core.

The first normalization unit 360 may normalize a core-specific time-frequency distribution obtained through the transformation by the first time-frequency distribution transform unit 340.

The distortion correction unit 380 may determine a faulty core by correcting a distortion of the core-specific time-frequency distribution normalized by the first normalization unit 360.

More specifically, as shown in FIG. 2, the distortion correction unit 380 may include a shift unit 381, a rotation unit 383, a contour extraction unit 385, an image merging unit 387, and a first faulty-core determination data extraction unit 389 to correct distortions and determine faulty cores.

The shift unit 381 may apply a column shift to the core-specific time-frequency distribution normalized by the first normalization unit 360 to move the core-specific time-frequency distribution. The shift unit 381 may be one image processing component for correcting a distortion of the normalized core-specific time-frequency distribution.

The rotation unit 383 may estimate the slope of the core-specific time-frequency distribution moved by the shift unit 381 through principal component analysis (PCA) and may rotate the core-specific time-frequency distribution on the basis of the estimated slope. The rotation unit 383 may be one image processing component for correcting a distortion of the slope of the normalized core-specific time-frequency distribution.

More specifically, the rotation unit 383 may estimate the slope of the core-specific time-frequency distribution in an image through the PCA and then may rotate the core-specific time-frequency distribution by as much as the estimated slope.

In this case, the rotation unit 383 may rotate the moved core-specific time-frequency distribution using a rotation angle calculation formula expressed in Equation 2 below:

$$\theta_i = \frac{\pi}{N}(i-1) \quad \text{[Equation 2]}$$

where $\theta_i$ is an angle by which an $i^{th}$ core should be rotated, N is the number of cores in the multi-core cable, and i is a core number of a core to be rotated.

The contour extraction unit 385 may extract a contour from the core-specific time-frequency distribution rotated by the rotation unit 383. The contour extraction unit 385 may be a component for deriving clear features (points, lines, areas, etc.) that the computer can perceive.

In this case, the contour extraction unit 385 may extract a contour from the rotated core-specific time-frequency distribution using a contour extraction formula expressed in Equation 3 below:

$$I_{new}(m,n) = e^{-a|I_{old}(m,n) - \sigma|} \quad \text{[Equation 3]}$$

where $I_{new}(m,n)$ is a new image (a contour image), $I_{old}(m,n)$ is an old image (an image before a contour is extracted), m and n are a row number and a column number in a time-frequency distribution image, a is a parameter value for determining the thickness of a contour, and $\sigma$ is a parameter value for determining the area of an ellipse.

In this case, as the value of a increases, the thickness of the contour may decrease. Also, the parameter value of $\sigma$ may have a value of 0 to 1. This is because image pixel values are normalized to a value between 0 and 1. As the value of $\sigma$ decreases, the area of an ellipse corresponding to the extracted contour may increase. However, when the value of $\sigma$ is too small, the shape of the ellipse is too large. When the value of $\sigma$ is too large, the shape of the ellipse is too small. Thus, it may be difficult to appropriately form features. For example, there are no overlapping points when merging images.

The image merging unit 387 may merge time-frequency distributions including core-specific contours extracted by the contour extraction unit 385 into one image. The image merging unit 387 may be a component which allows the core-specific contours to overlap each other and derives a point, a line, an area, etc., which are generated through the overlapping.

The first faulty-core determination data extraction unit 389 may extract faulty-core determination data from information regarding at least one of a point, a line, and an area formed by the overlapping core-specific contours by means of one image obtained through the merge by the image merging unit 387. The first faulty-core determination data extraction unit 389 may be a component for extracting data in order to increase the accuracy of the determination and classification of the fault by allowing a computer to perceive the point, line, area, and the like derived through the overlapping of the core-specific contours.

Meanwhile, when the baseline data of the multi-core cable is present, the data processing unit 300 may include the second time-frequency distribution transform unit 310, the second normalization unit 330, and the second faulty-core determination data extraction unit 350.

The second time-frequency distribution transform unit 310 may compare the baseline data of the multi-core cable and the core-specific reflected signals measured by the reflected-signal measurement unit 200, extract core-specific partial time-series data having a difference therebetween, and transform the partial time-series data into a time-frequency distribution. The second time-frequency distribution transform unit 310 may be a component for extracting and transforming only partial time-series data having a difference between the measured core-specific reflected signal and the baseline data of the multi-core cable in the entire time-series data of the signal, i.e., only factor data necessary to determine a fault.

The second normalization unit 330 may arrange core-specific time-frequency distributions obtained through the transform by the second time-frequency distribution transform unit 310 as one image and then normalize the image on the basis of a core-specific time-frequency distribution having the largest value. The second normalization unit 330 may be a component for performing pre-processing in order to classify a faulty core using a neural network. That is, the second normalization unit 330 may arrange core-specific time-frequency distributions as one image and normalize the image on the basis of a core-specific time-frequency distribution having the largest value in order to minimize the influence of a fault generated in any core on another core. As in the case where the baseline data is not present, normalization may be performed for each core, and then distributions may be merged into one image. In this case, when max pooling is performed, all the cores have large values and thus it is not possible to classify a faulty core.

The second faulty-core determination data extraction unit 350 may extract faulty-core determination data by performing max-pooling on the image normalized by the second normalization unit 330. The second faulty-core determination data extraction unit 350 may be a component for extracting faulty-core determination data that a computer can perceive in order to increase the accuracy of the determination and classification of a fault using a computer.

The faulty core classification unit 400 may classify a faulty core from the multi-core cable by inputting the faulty-core determination data extracted by the first faulty-core determination data extraction unit 389 or the second faulty-core determination data extraction unit 350 to a neural network. The faulty core classification unit 400 may be a component for automating fault classification for the multi-core cable through computer-based machine learning, artificial neural networks, or the like.

Figure 3:
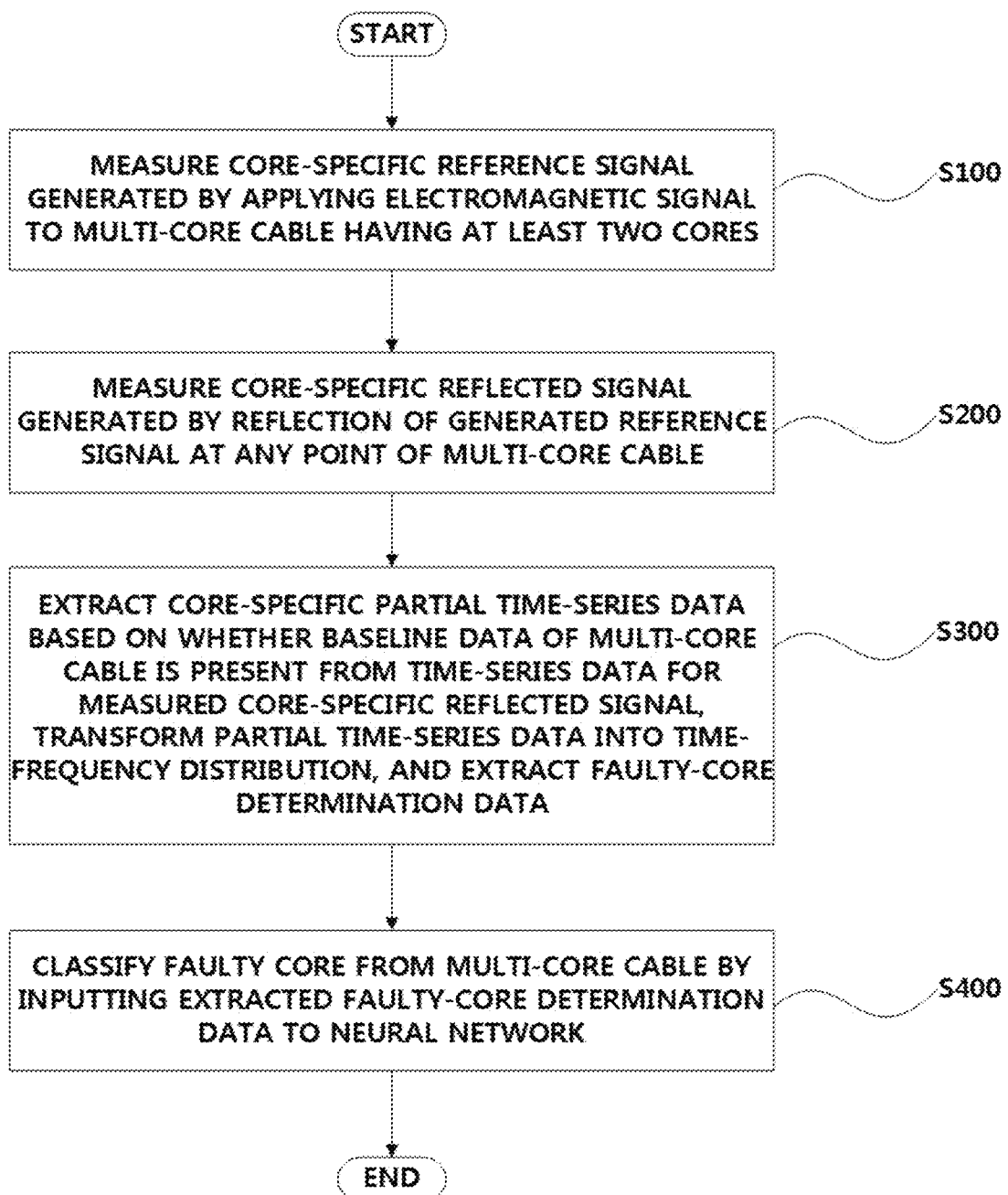
FIG. 3 is a flowchart illustrating a multi-core cable fault classification method according to an embodiment of the present invention.
Figure 4:
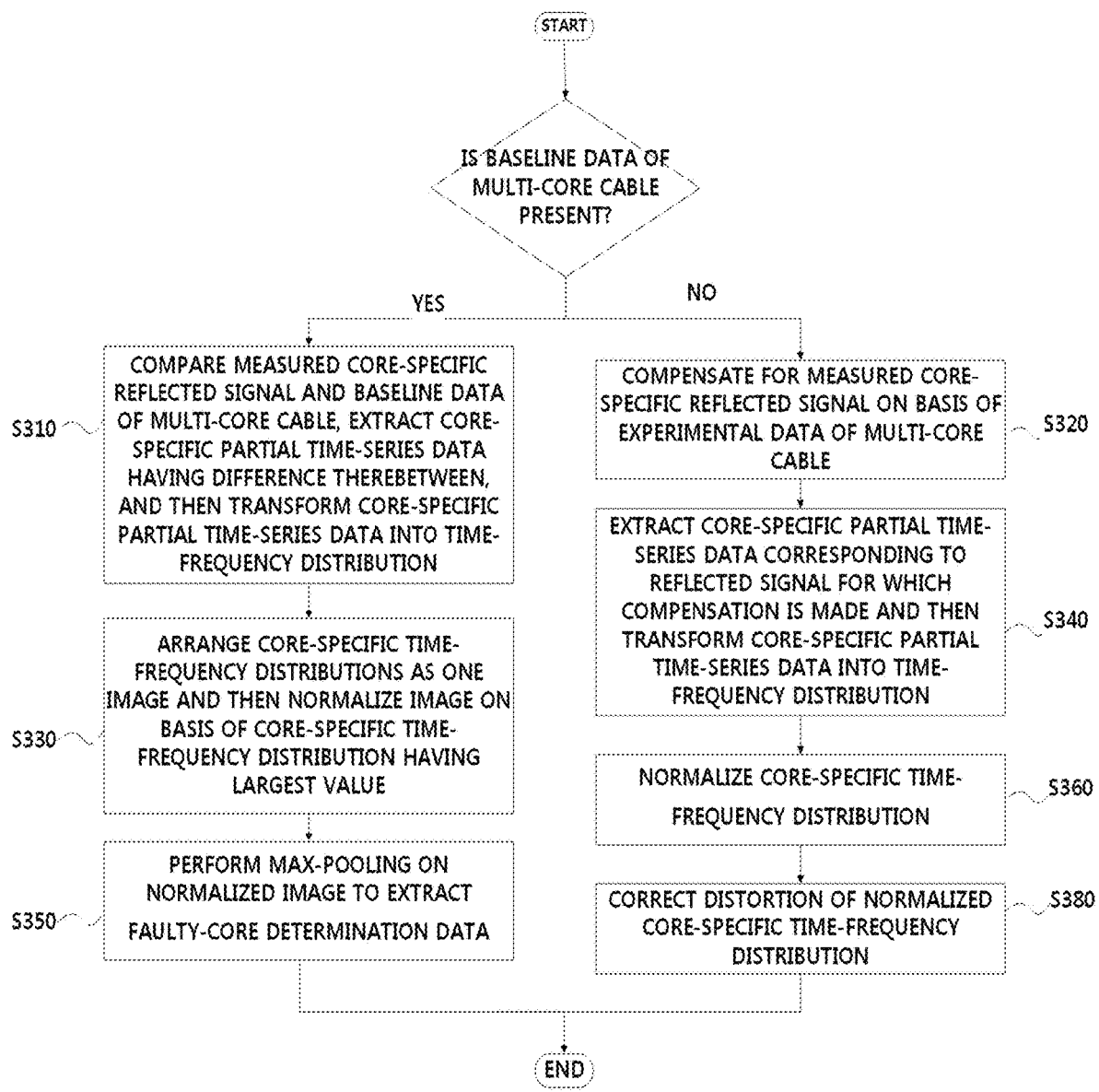
FIG. 4 is a diagram illustrating a data processing operation S300 of FIG. 3.
Figure 5:
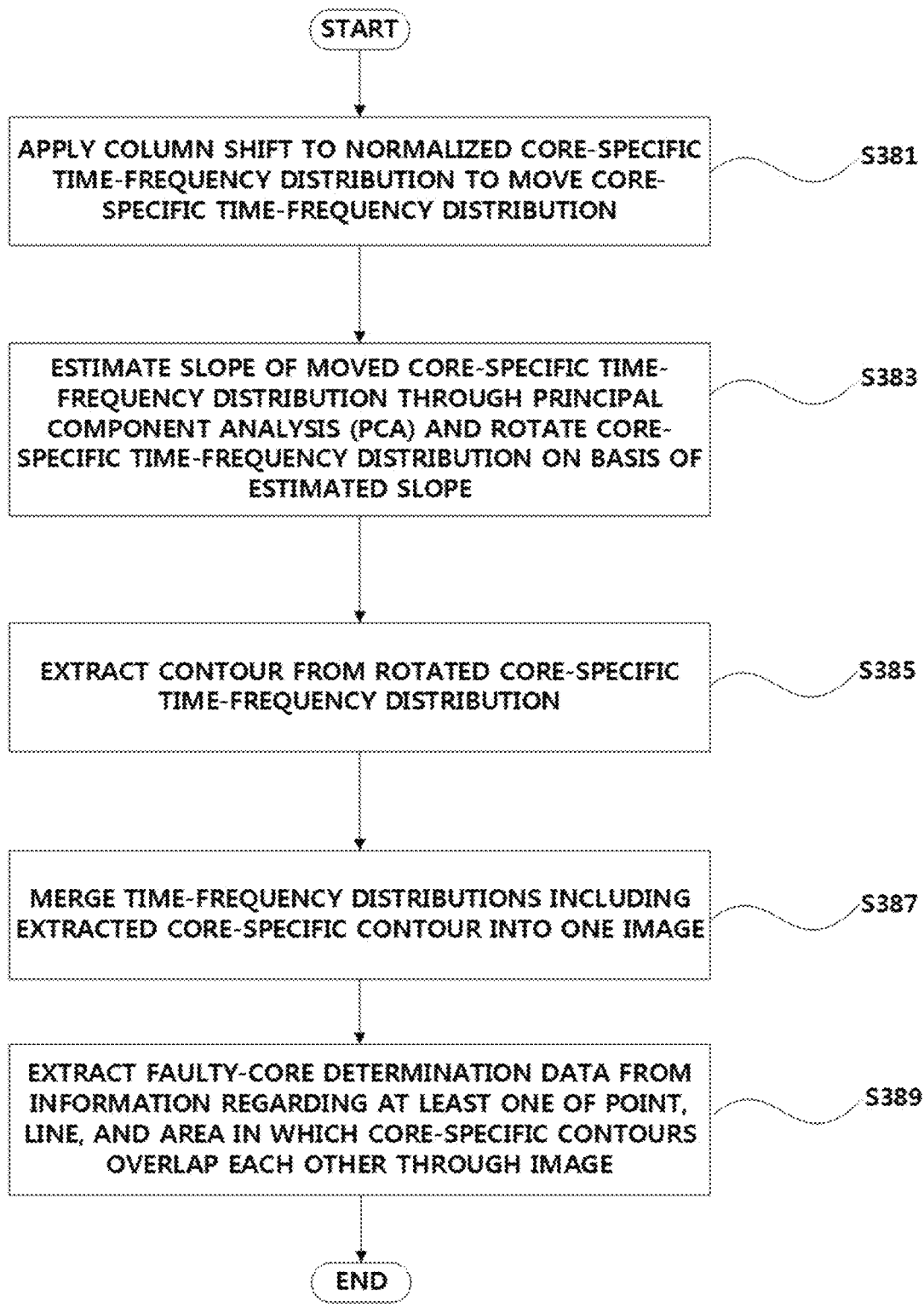
FIG. 5 is a diagram illustrating a distortion correction operation S380 of FIG. 4.

FIG. 3 is a flowchart illustrating a multi-core cable fault classification method according to an embodiment of the present invention, FIG. 4 is a diagram illustrating a data processing operation S300 of FIG. 3, and FIG. 5 is a diagram illustrating a distortion correction operation S380 of FIG. 4.

Referring to FIG. 3, the multi-core cable fault classification method according to an embodiment of the present invention may include a reference signal measurement operation S100, a reflected-signal measurement operation S200, a data processing operation S300, and a faulty core classification operation S400.

The reference signal measurement operation may include measuring a core-specific reference signal which is generated by applying an electromagnetic signal to a multi-core cable having at least two or more cores (S100). The reference signal measurement operation may be an operation for measuring a reference signal, which is one piece of signal data used to determine and classify a faulty core of the multi-core cable.

The reflected-signal measurement operation may include measuring a core-specific reflected signal which is generated by reflecting the reference signal generated by applying the electromagnetic signal at any point of the multi-core cable (S200). The reflected-signal measurement operation may be an operation for measuring a reflected signal, which is one piece of signal data used to determine and classify a faulty core of the multi-core cable.

The data processing operation may include extracting core-specific partial time-series data from time-series data for the core-specific reflected signal measured in operation S200 (S300). Also, the data processing operation may include transforming the core-specific partial time-series data into a time-frequency distribution to extract faulty-core determination data (S300).

In this case, the data processing operation S300 may include extracting core-specific partial time-series data on the basis of whether the baseline data of the multi-core cable is present, transforming the core-specific partial time-series data into a time-frequency distribution, and determining a fault core.

The baseline data of the multi-core cable may be data regarding a reflected signal measured when no fault exists in the multi-core cable. That is, the baseline data of the multi-core cable may be data regarding a reflected signal which is generated by reflecting the reference signal generated by applying the electronic magnetic signal to the multi-core cable at any point of the cable when no fault exists in the corresponding cable.

More specifically, as shown in FIG. 4, the data processing operation S300 may include a second time-frequency distribution transform operation S310, a reflected-signal compensation operation S320, a second normalization operation S330, a first time-frequency distribution transform operation S340, a second faulty-core determination data extraction operation S350, a first normalization operation S360, and a distortion correction operation S380 and may be performed differently depending on whether the baseline data of the multi-core cable is present or not.

When the baseline data of the multi-core cable is not present, the data processing operation S300 may include the reflected-signal compensation operation S320, the first time-frequency distribution transform operation S340, the first normalization operation S360, and the distortion correction operation S380.

The reflected-signal compensation operation may include compensating for the core-specific reflected signal measured in operation S200 on the basis of experimental data of the multi-core cable (S320). The reflected-signal compensation operation may be an operation for compensating for the reflected signal in order to complement a problem of a reflectometry in which a signal is distorted according to a traveled distance.

In this case, the experimental data is data obtained through a pre-experiment and may be data obtained by measuring the degree of distortion of a reference signal in the TFDR, i.e., an attenuation characteristic. The reflected-signal compensation operation may include compensating for the distortion of the reflected signal on the basis of the experimental data to restore the reflected signal.

The reflected-signal compensation operation may include compensating for the core-specific reflected signal measured in operation S200 on the basis of the experimental data using a signal distortion degree calculation formula expressed in Equation 1 below (S320):

$$\zeta(t) = \frac{|H(S_r(t))|}{|H(S_o(t))|} \quad \text{[Equation 1]}$$

where ζ(t) is an attenuation rate value in time series, H is a Hilbert transform value, r is a reflected signal value, o is a reference signal value, $S_r(t)$ is a reflected signal value in time series, $S_o(t)$ is a reference signal value in time series, $H(S_r(t))$ is a Hilbert transform value of the reflected signal, $H(S_o(t))$ and is a Hilbert transform value of the reference signal.

The first time-frequency distribution transform operation may include extracting core-specific partial time-series data corresponding to the reflected signal for which compensation is made in operation S320 and then transforming the core-specific partial time-series data into a time-frequency distribution (S340). The first time-frequency distribution transform operation may be an operation for extracting and transforming only factor data necessary to determine a failure using a fact that in the entire time-series data of the signal, a reflected signal returned from a faulty core is distinguished from a reflected signal returned from a normal core.

The first normalization operation may include normalizing the core-specific time-frequency distribution obtained in operation S340 (S360).

The distortion correction operation may include determining a faulty core by correcting a distortion of the core-specific time-frequency distribution normalized in operation S360 (S380).

More specifically, as shown in FIG. 5, the distortion correction operation S380 may include a shift operation S381, a rotation operation S383, a contour extraction operation S385, an image merging operation S387, and a first faulty-core determination data extraction operation S389 to correct distortions and determine faulty cores.

The shift operation may include applying a column shift to the core-specific time-frequency distribution normalized in S360 to move the core-specific time-frequency distribution (S381). The shift operation may be one image processing operation for correcting a distortion of the normalized core-specific time-frequency distribution.

The rotation operation may include applying principal component analysis (PCA) to the core-specific time-frequency distribution moved in operation S381 to rotate the core-specific time-frequency distribution (S383). The rotation operation may be one image processing operation for correcting a distortion of the normalized core-specific time-frequency distribution.

More specifically, the rotation operation S383 may include estimating the slope of the core-specific time-frequency distribution in an image through the PCA and then rotating the core-specific time-frequency distribution on the basis of the estimated slope. The rotation operation may be one image processing operation for correcting a distortion of the slope of the core-specific time-frequency distribution.

More specifically, the rotation operation S383 may include estimating the slope of the core-specific time-frequency distribution in an image through the PCA and then rotating the core-specific time-frequency distribution by as much as the estimated slope.

In this case, the rotation operation S383 may include rotating the moved core-specific time-frequency distribution according to a rotation angle calculation formula expressed in Equation 2 below:

$$\theta_i = \frac{\pi}{N}(i-1) \quad \text{[Equation 2]}$$

where $\theta_i$ is an angle by which an $i^{th}$ core should be rotated, N is the number of cores in the multi-core cable, and i is a core number of a core to be rotated.

The contour extraction operation may include extracting a contour from the core-specific time-frequency distribution rotated in S383 (S385). The contour extraction operation may be an operation for deriving clear features (points, lines, areas, etc.) that the computer can perceive.

In this case, the contour extraction operation S385 may include extracting a contour from the rotated core-specific time-frequency distribution according to a contour extraction formula expressed in Equation 3 below.

$$I_{new}(m,n) = e^{-a|I_{old}(m,n)-\sigma|} \quad \text{[Equation 3]}$$

where $I_{new}(m,n)$ is a new image (a contour image), $I_{old}(m,n)$ is an old image (an image before a contour is extracted), m and n are a row number and a column number in a time-frequency distribution image, a is a parameter value for determining the thickness of a contour, and σ is a parameter value for determining the area of an ellipse.

In this case, as the value of a increases, the thickness of the contour may decrease. Also, the parameter value of σ may have a value of 0 to 1. This is because image pixel values are normalized to a value between 0 and 1. As the value of σ decreases, the area of an ellipse corresponding to the extracted contour may increase. However, when the value of σ is too small, the shape of the ellipse is too large. When the value of σ is too large, the shape of the ellipse is too small. Thus, it may be difficult to appropriately form features, for example, there are no overlapping points when merging images.

The image merging operation may include merging time-frequency distributions including core-specific contours extracted in operation S385 to one image (S387). The image merging operation may be an operation for allowing the core-specific contours to overlap each other and deriving a point, a line, an area, etc., which are generated through the overlapping.

The first faulty-core determination data extraction operation may include extracting faulty-core determination data from information regarding at least one of a point, a line, and an area formed by the overlapping core-specific contours by means of one image obtained through the merge in operation S387. The first faulty-core determination data extraction operation may include an operation for extracting data in order to increase the accuracy of the determination and classification of the fault by allowing a computer to perceive the point, line, area, and the like derived through the overlapping of the core-specific contours.

Meanwhile, when the baseline data of the multi-core cable is present, the data processing operation S300 may include the second time-frequency distribution transform operation S310, the second normalization operation S330, and the second faulty-core determination data extraction operation S350.

The second time-frequency distribution transform operation may include comparing the baseline data of the multi-core cable and the core-specific reflected signals measured in operation S200, extracting partial time-series data having a difference therebetween, and transforming the partial time-series data into a time-frequency distribution (S310). The second time-frequency distribution transform operation may include an operation for extracting and transforming only partial time-series data having a difference between the measured core-specific reflected signal and the baseline data of the multi-core cable in the entire time-series data of the signal, i.e., only factor data necessary to determine a fault.

The second normalization operation may include arranging core-specific time-frequency distributions obtained through the transform in operation S310 as one image and then normalizing the image on the basis of a core-specific time-frequency distribution having the largest value (S330). The second normalization operation may be an operation for performing pre-processing in order to classify a faulty core using a neural network. That is, the second normalization operation may be an operation for arranging core-specific time-frequency distributions as one image and normalizing the image on the basis of a core-specific time-frequency distribution having the largest value in order to minimize the influence of a fault generated in any core on another core. As in the case where the baseline data is not present, normalization may be performed for each core, and then distributions may be merged into one image. In this case, when max pooling is performed, all the cores have large values and thus it is not possible to classify a faulty core.

The second faulty-core determination data extraction operation may include extracting a faulty-core determination data by performing max-pooling on the image normalized in operation S330 (S350). The second faulty-core determination data extraction operation may be an operation for extracting faulty-core determination data that a computer can perceive in order to increase the accuracy of the determination and classification of a fault using a computer.

The faulty core classification operation may include classifying a faulty core from the multi-core cable by inputting the faulty-core determination data extracted in operation S389 or S350 to a neural network (S400). The faulty core classification operation may be an operation for automating fault classification for the multi-core cable through computer-based machine learning, artificial neural networks, or the like.

Figure 6:
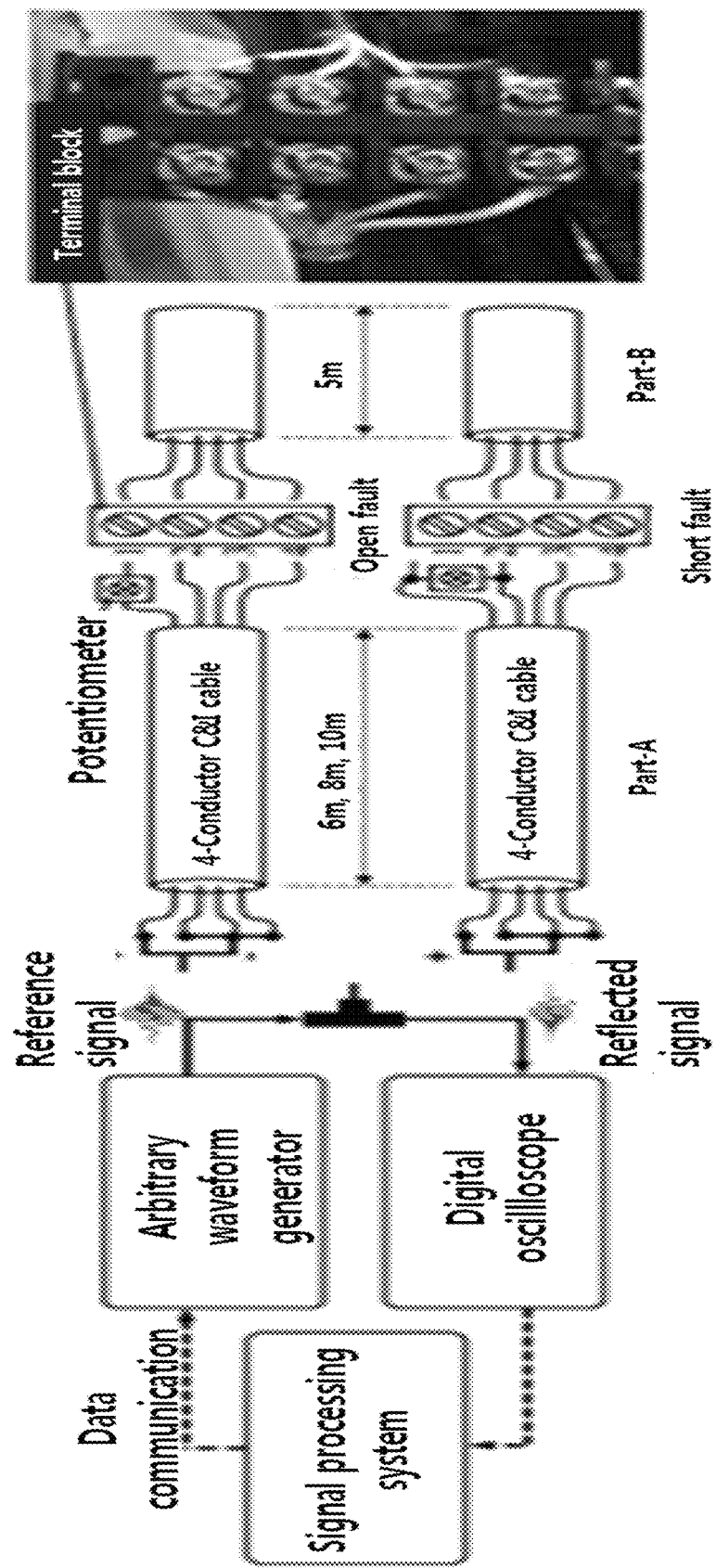
FIG. 6 is a diagram showing an experimental setup according to an embodiment of the present invention.

FIG. 6 is a diagram showing an experimental setup according to an embodiment of the present invention.

Referring to FIG. 6, the number of cores of a multi-core cable may be set to be four in an experiment according to an embodiment of the present invention. When the TFDR is applied to each core to perform a measurement, four pieces of reflected signal data (data about core 1, data about core 2, data about core 3, and data about core 4) may be acquired for one fault type. The reflected signal data may be data about core-specific reflected signals measured by the reference signal measurement unit 100 and the reflected-signal measurement unit 200 of the present invention.

More specifically, a method of obtaining core-specific data is as follows. Since either of (+) polarity or (−) polarity should be applied to each core in order to apply the TFDR, each of (+) polarity and (−) polarity was applied to one core in the conventional method.

On the other hand, according to the present invention, data may be acquired by applying (+) polarity to one core and applying (−) polarity to the other cores. It is assumed that this method is applied to a multi-core cable having N cores. A total of N(N−1) measurements have to be made to perform one experiment in the conventional method, whereas data may be acquired by making a total of only N measurements even if several experiments are performed according to the present invention.

Thus, it is possible to increase fault measurement efficiency by adjusting the numbers and positions of cores to which (+) polarity and (−) polarity are applied.

Figure 7B:
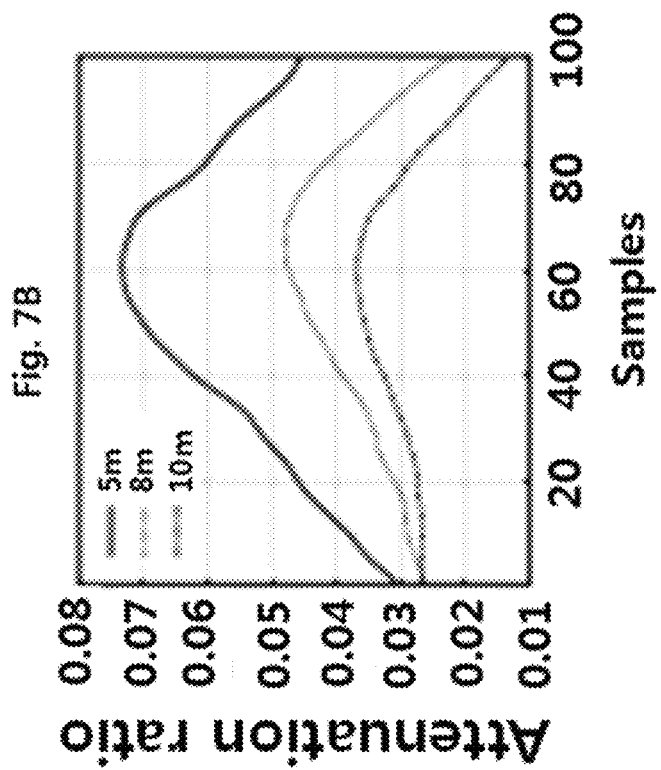
FIGS. 7A and 7B are diagrams showing propagation characteristics of a Gaussian-enveloped linear chirp (GELC) signal according to an embodiment of the present invention.
Figure 7A:
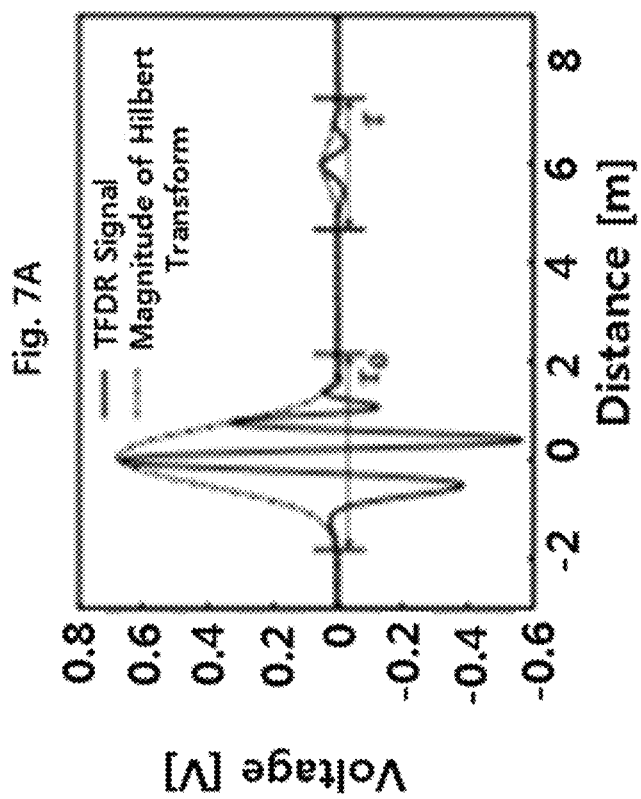

FIGS. 7A and 7B are diagrams showing propagation characteristics of a Gaussian-enveloped linear chirp (GELC) signal according to an embodiment of the present invention. In this case, FIG. 7A is a diagram illustrating an attenuation of a GELC signal corresponding to signal propagation as time-series data.

FIGS. 8A and 8B are diagrams showing a reflected-signal compensation result according to an embodiment of the present invention. In this case, FIG. 8A is a diagram illustrating a measurement voltage result of a reflected signal for which compensation is made, and FIG. 8B is a diagram illustrating a cross-correlation result of a reflected signal for which compensation is made.

First, referring to FIGS. 7A and 7B, the present invention is a technique of which the main feature is to determine and classify which core of a multi-core cable has a fault. According to the present invention, it is possible to extract a corresponding feature and classify a fault through a neural network using a fact that when a fault is generated in a specific core among multiple cores, a reflected signal returned from the fault core is distinguished from that of a normal core.

In particular, according to the present invention, the TFDR is used among reflectometries to have features in both the time and the frequency domains. In this case, a reflected signal in the reflectometry is distorted according to a propagation distance as shown in

FIG. 7A.

Accordingly, according to the present invention, signal compensation is performed according to a distance so as to increase the accuracy of fault classification. After the degree of distortion of a reference signal corresponding to a propagation distance is measured as shown in FIG. 7B, the signal compensation may be made for a reflected signal returned from an actual fault as shown in FIGS. 8A and 8B. In this case, FIG. 7B shows that the degree of distortion of the reference signal corresponding to the propagation distance may be data obtained through a pre-experiment.

FIGS. 9A to 9J are time-frequency distributions of a GELC signal designed with a center frequency of 100 MHz, a frequency bandwidth of 180 MHz, and a time duration of 25 ns according to an embodiment of the present invention. In this case, FIG. 9A is a Wigner-Vile distribution (WVD) of a reference signal, FIG. 9B is a WVD of a reflected signal (without compensation) reflected at the 6-meter point of the cable, FIG. 9C is a WVD of a reflected signal (with compensation) reflected at the 6-meter point of the cable, FIG. 9D is a WVD of a reflected signal reflected at the 10-meter point of the cable, FIG. 9E is a WVD of a reflected signal (with compensation) reflected at the 10-meter point of the cable, FIG. 9F is contours of a WVD (COWVD) of a reference signal, FIG. 9G is COWVD of a reflected signal (without compensation) reflected at the 6-meter point of the cable, FIG. 9H is COWVD of a reflected signal (with compensation) reflected at the 6-meter point of the cable, FIG. 9I is COWVD of a reflected signal (without compensation) reflected at the 10-meter point of the cable, and FIG. 9J is COWVD of a reflected signal (with compensation) reflected at the 10-meter point of the cable.

As shown in FIGS. 9A to 9J, according to the present invention, it is possible to analyze, in the time-frequency domain, a reflected signal reflected at a point where a fault is generated in a multi-core cable, and it is also possible to check whether signal compensation made in time-series data is appropriate through the WVD. In particular, when an elliptical shape in a WVD is similar to the reference signal, fewer errors occur during automatic classification through a neural network such as machine learning.

FIGS. 10A to 10F and 11A to 11F are diagrams showing image processing of a time-frequency distribution when the baseline data of a multi-core cable is not present according to an embodiment of the present invention.

Figure 10A:
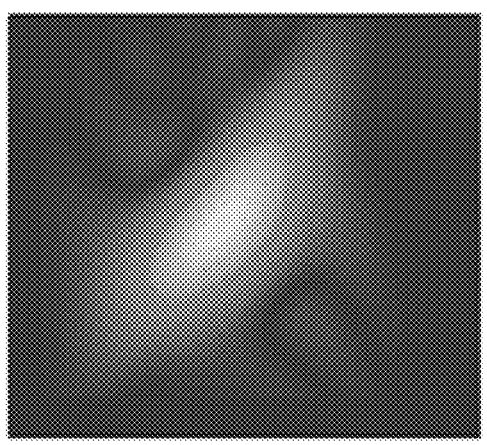
FIGS. 10A to 10F and 11A to 11F are diagrams showing image processing of time-frequency distributions when the baseline data of a multi-core cable is not present according to an embodiment of the present invention.
Figure 10B:
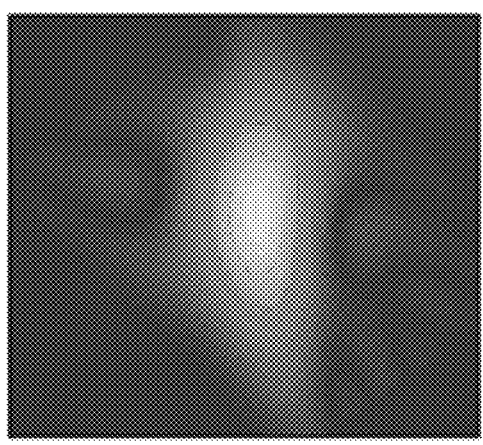
Figure 10C:
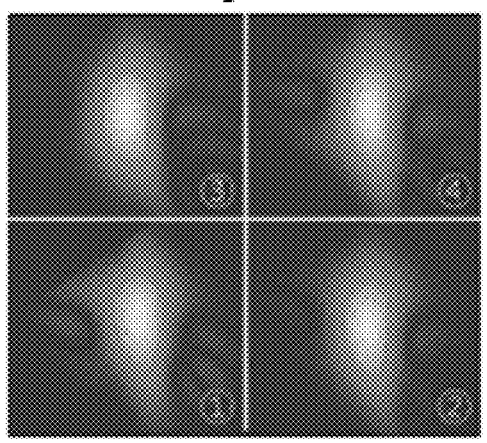
Figure 10D:
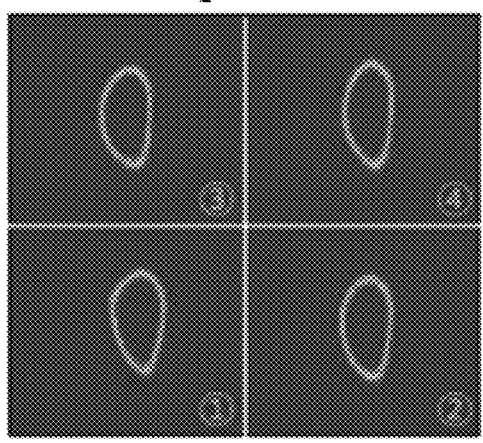
Figure 10E:
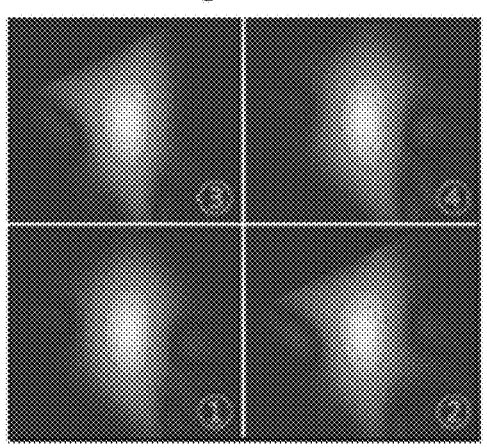
Figure 10F:
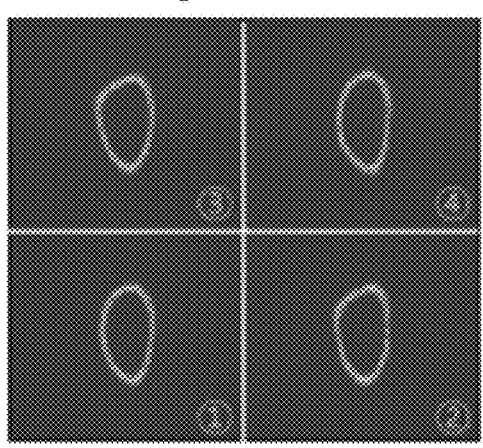

In this case, FIG. 10A is a diagram showing a result of moving a time-frequency distribution by applying a column shift to the time-frequency distribution, FIG. 10B is a diagram showing a result of rotating a time-frequency distribution by applying the PCA to the time-frequency distribution, FIG. 10C is a diagram showing an arranged transformation image (ATI) in which core 1 is faulty, FIG. 10D is a diagram showing an arranged contour image (ACI) in which core 1 is faulty, FIG. 10E is a diagram showing an ATI in which core 2 and core 3 are faulty, and FIG. 10F is a diagram showing an ACI in which core 2 and core 3 are faulty.

Referring to FIGS. 10A to 10F, when the baseline data of the multi-core cable is not present, it is not possible to find a difference between a reflected signal of a normal cable and a reflected signal of a faulty cable. Thus, image processing of the time-frequency distribution is required.

In order to correct the degree of distortion of a reflected-signal distribution transformed into a WVD in the frequency domain, the reflected-signal distribution may be column-shifted and then rotated in an image as shown in FIG. 10A. In this case, the slope in the image may be estimated through the PCA. A result of rotating the reflected-signal distribution in the image may be seen in FIG. 10B.

Also, as shown in FIGS. 10D and 10F, a specific contour, i.e., an elliptical shape image, may be extracted from the rotated distribution as shown in FIGS. 10C and 10E.

Figure 11A:
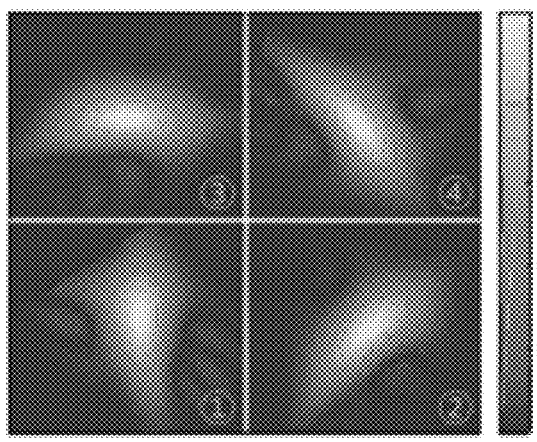
Figure 11B:
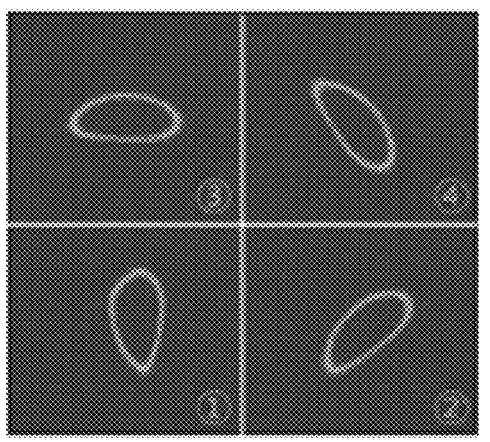
Figure 11C:
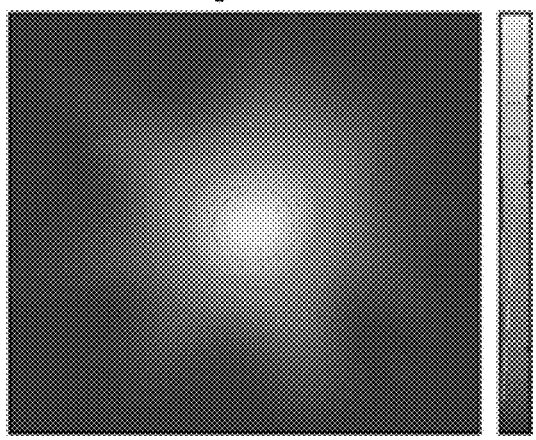
Figure 11D:
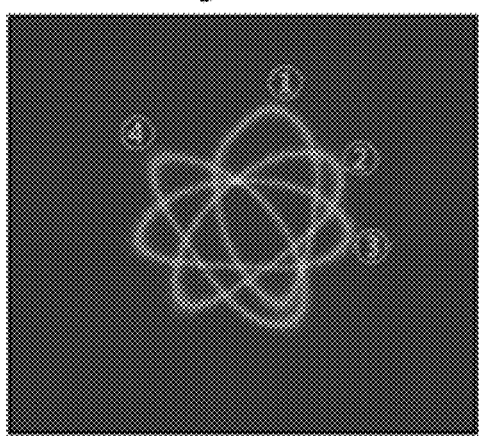
Figure 11E:
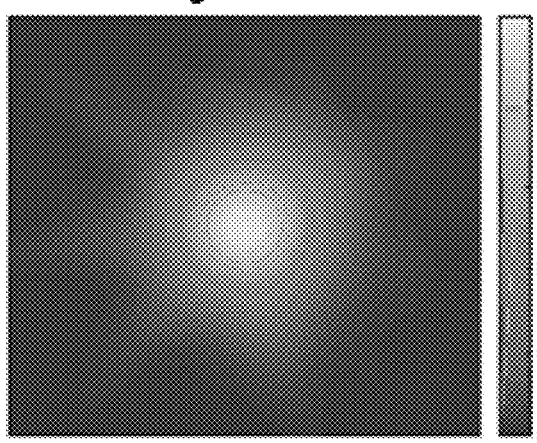
Figure 11F:
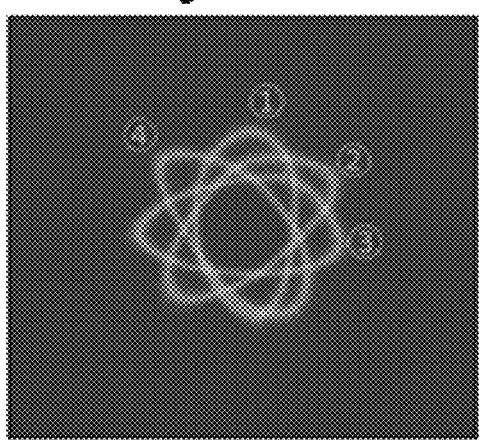

FIG. 11A is a diagram showing an instantaneous frequency (IF) rotation (a slope axis of an ellipse in a WVD image) of an ATI, FIG. 11B is a diagram showing an IF rotation of an ACI, FIG. 11C is a diagram showing a combined rotational transformation image (CRTI) in which core 1 is faulty, FIG. 11D is a diagram showing a combined rotational contour image (CRCI) in which core 2 and core 3 are faulty, FIG. 11E is a diagram showing a CRTI in which core 2 and core 3 are faulty, and FIG. 11F is a diagram showing a CRCI in which core 2 and core 3 are faulty.

As shown in FIG. 11B, for a 4-core cable, core-specific distributions may be rotated by different angles (which are calculable using Equation 2). As shown in FIGS. 11C and 11E, the core-specific distributions may be merged into one image.

FIG. 11D shows that core 1 may be determined to be a faulty core when a fault is generated in core 1, and FIG. 11F shows that core 2 and core 3 may be determined to be faulty cores when core 2 and core 3 are short-circuited.

As shown in FIGS. 11A to 11F, the distributions being rotated by a certain angle and then merged may have the following advantages. First, contours overlap each other, and the overlapping position varies depending on the fault. Thus, advantageously, it is possible to find which core has a fault. Also, by merging N images, the number of pieces of data is reduced by 1/N. Advantageously, this reduction may cause an increase in data processing efficiency.

The reason for the process as shown in FIGS. 11A to 11F is that it is difficult for computer-based machine learning and artificial neural networks to detect a minute change in perceiving an elliptical shape. Accordingly, by newly deriving the position of a point generated when contours overlap each other, the process may allow a computer to easily perceive the feature. When a convolutional neural network (CNN) is applied to an image processed in this way, classification is possible with very high accuracy as shown in Table 1 below:

TABLE 1

| | Training set Test set | data-6 | data-6 data-8 | data-10 | data-6 | data-8 data-8 | data-10 | data-6 | data-10 data-8 | data-10 | Total Average [%] |
|---|---|---|---|---|---|---|---|---|---|---|---|
| ATI [%] | w/o Compensation | 100 | 78.8 | 70.2 | 93.6 | 100 | 98.2 | 64.5 | 97.1 | 100 | 85.9 |
| | Average | | 77.8 | | | 96.4 | | | 83.3 | | |
| | with compensation | 100 | 99.0 | 86.2 | 85.4 | 100 | 92.7 | 78.8 | 95.2 | 100 | 90.9 |
| | Average | | 93.6 | | | 90.5 | | | 88.7 | | |
| ACI [%] | w/o Compensation | 100 | 81.3 | 42.1 | 91.6 | 100 | 99.2 | 56.8 | 94.5 | 100 | 80.5 |
| | Average | | 66.7 | | | 96.0 | | | 78.8 | | |
| | with compensation | 100 | 99.2 | 85.6 | 86.2 | 100 | 94.6 | 80.9 | 97.0 | 100 | 91.8 |
| | Average | | 93.4 | | | 91.7 | | | 90.4 | | |
| CRTI [%] | w/o Compensation | 100 | 69.9 | 53.8 | 55.3 | 100 | 92.2 | 54.7 | 93.0 | 100 | 73.8 |
| | Average | | 66.9 | | | 77.2 | | | 77.3 | | |
| | with compensation | 100 | 89.8 | 72.2 | 88.1 | 100 | 90.8 | 75.6 | 92.1 | 100 | 86.8 |
| | Average | | 83.6 | | | 90.8 | | | 86.0 | | |
| CRCI [%] | w/o Compensation | 100 | 79.4 | 44.4 | 93.0 | 100 | 91.4 | 69.1 | 92.4 | 100 | 81.1 |
| | Average | | 66.8 | | | 93.2 | | | 83.3 | | |
| | Experimental Result according to Embodiments of the Present Invention | | | | | | | | | | |
| | with compensation | 100 | 99.2 | 93.0 | 93.8 | 100 | 97.8 | 89.1 | 99.6 | 100 | 96.0 |
| | Average | | 96.6 | | | 96.3 | | | 95.1 | | |

Table 1 is a table showing the accuracy of classification as a result of an experiment when the baseline data of the multi-core cable is not present.

As shown in Table 1, it can be seen that the fault classification technique for a multi-core cable using a compensation method and CRCI according to an embodiment of the present invention can classify a fault with very high accuracy compared to the other techniques.

Meanwhile, FIGS. 12A and 12B are diagrams showing image processing of time-frequency distributions when the baseline data of a multi-core cable is present according to an embodiment of the present invention. In this case, FIG. 12A is a diagram showing normalization of the arranged WVD (NAWVD) in which core 1 is faulty, and FIG. 12B is a diagram showing NAWVD in which core 2 and core 3 are faulty.

Referring to FIGS. 12A and 12B, the image processing may include comparing a core-specific reflected signal to the baseline data of the multi-core cable, extracting core-specific partial time-series data having a difference therebetween, transforming the partial time-series data into time-frequency distributions, arranging the time-frequency distributions in the order of the cores, normalizing the time-frequency distributions, and then performing max-pooling to extract faulty-core determination data.

Among the time-frequency distributions on which max-pooling is performed, a core corresponding to a time-frequency distribution having the largest characteristic impedance change value may be determined as a faulty core. FIG. 12A shows that core 1 is determined as a faulty core, and FIG. 12B shows that core 2 and core 3 are determined as faulty cores.

The above described multi-core cable fault classification system and method have the following advantageous effects.

First, it is possible to automate fault classification for a multi-core cable through computer-based machine learning, artificial neural networks, or the like.

Second, it is possible to automatically determine and classify which core of a multi-core cable has a fault.

Third, it is possible to implement a fault determination and classification technique through image processing regardless of the presence or absence of the baseline data of the multi-core cable, that is, data measured when no fault exists.

Fourth, it is possible to increase the accuracy of the fault determination and classification by compensating for a distortion of a reflected signal corresponding to a propagation distance.

Fifth, it is possible to increase the accuracy of the fault determination and classification by deriving clear features (a point, a line, an area, etc.) that a computer can perceive.

Sixth, it is possible to increase fault measurement efficiency by adjusting the numbers and positions of cores to which (+) polarity and (−) polarity are applied.

While exemplary embodiments for illustrating the technical spirit of the present invention have been described and shown above, it will be understood by those skilled in the art that the present invention is not limited to the configurations and operations as shown and described above and various changes and modifications may be made without departing from the technical scope of the invention. Therefore, all such appropriate changes and modifications should be considered to be within the scope of the invention.

What is claimed is:

1. A multi-core cable fault classification system comprising:
   a reference signal measurement unit configured to measure a core-specific reference signal generated by applying an electromagnetic signal to a multi-core cable having at least two cores;
   a reflected-signal measurement unit configured to measure a core-specific reflected signal generated by a reflection of the generated core-specific reference signal at a point of the multi-core cable;
   a data processing unit configured to
      compare, based on whether baseline data of the multi-core cable is present, the measured core-specific reflected signal and the baseline data of the multi-core cable,
      extract, from time-series data for the measured core-specific reflected signal, only core-specific partial time-series data having a difference between the measured core-specific reflected signal and the baseline data of the multi-core cable,
      transform only the core-specific partial time-series data having the difference into a core-specific time-frequency distribution, and
      extract faulty-core determination data based on the transformed core-specific partial time-series data; and
   a faulty core classification unit configured to classify a fault core from the multi-core cable by inputting the extracted faulty-core determination data to a neural network,
   wherein the reference signal measurement unit, the reflected-signal measurement unit, the data processing unit, and the faulty core classification unit are each implemented via at least one processor, and
   wherein the data processing unit is further configured to, based on a determination that the baseline data of the multi-core cable is present:
      arrange core-specific time-frequency distributions of the core-specific partial time-series data having the difference as one image and then normalize the image on a basis of a core-specific time-frequency distribution having a maximum value among the core-specific time-frequency distributions arranged as one image; and
      perform max-pooling on the normalized image to extract the faulty-core determination data.

2. The multi-core cable fault classification system of claim 1, wherein the baseline data of the multi-core cable is data regarding a reflected signal measured when no fault exists in the multi-core cable.

3. The multi-core cable fault classification system of claim 1, wherein the data processing unit is further configured to, based on a determination that the baseline data of the multi-core cable is not present:
   compensate for the measured core-specific reflected signal on a basis of experimental data of the multi-core cable;
   extract core-specific partial time-series data corresponding to the reflected signal for which compensation is made and configured to transform the core-specific partial time-series data into a core-specific time-frequency distribution;
   normalize the core-specific time-frequency distribution; and
   correct a distortion of the normalized core-specific time-frequency distribution.

4. The multi-core cable fault classification system of claim 3, wherein the data processing unit is further configured to compensate for the measured core-specific reflected signal on the basis of experimental data using a signal distortion degree calculation formula expressed in Equation 1 below:

$$\zeta(t) = \frac{|H(S_r(t))|}{|H(S_o(t))|} \quad \text{[Equation 1]}$$

where $\zeta(t)$ is an attenuation rate in time series, H is a Hilbert transform value, r is a reflected signal value, o is a reference signal value, $S_r(t)$ is a reflected signal in time series, $S_o(t)$ is a reference signal in a time series, $H(S_r(t))$ is a Hilbert transform of the reflected signal, and $H(S_o(t))$ is a Hilbert transform value of the reference signal.

5. The multi-core cable fault classification system of claim 3, wherein the data processing unit is further configured to:
apply a column shift to the normalized core-specific time-frequency distribution to move the core-specific time-frequency distribution;
estimate a slope of the moved core-specific time-frequency distribution through principal component analysis (PCA) and rotate the core-specific time-frequency distribution on a basis of the estimated slope;
extract core-specific contours from the rotated core-specific time-frequency distribution;
merge the extracted core-specific contours into one image; and
extract faulty-core determination data from information regarding at least one of a point, a line, and an area in which the core-specific contours overlap each other through the image.

6. The multi-core cable fault classification system of claim 5, wherein the data processing unit is further configured to rotate the moved core-specific time-frequency distribution using a rotation angle calculation formula expressed in Equation 2 below:

$$\theta_i = \frac{\pi}{N}(i-1) \quad \text{[Equation 2]}$$

where $\theta_i$ is an angle by which an $i^{th}$ core is rotated, N is the number of cores in the multi-core cable, and i is a core number of a core that is rotated.

7. The multi-core cable fault classification system of claim 5, wherein the data processing unit is further configured to extract a contour from the rotated core-specific time-frequency distribution using a contour extraction formula expressed in Equation 3 below:

$$I_{new}(m,n) = e^{-a|I_{old}(m,n) - \sigma|} \quad \text{[Equation 3]}$$

where $I_{new}(m, n)$ is a new image (a contour image), $I_{old}(m, n)$ is an old image (an image before a contour is extracted), m and n are a row number and a column number in a time-frequency distribution image, a is a parameter value for determining a thickness of a contour, and $\sigma$ is a parameter value for determining an area of an ellipse.

8. A multi-core cable fault classification method comprising:
measuring a core-specific reference signal generated by applying an electromagnetic signal to a multi-core cable having at least two cores;
measuring a core-specific reflected signal generated by reflection of the generated core-specific reference signal at a point of the multi-core cable;
comparing, based on whether baseline data of the multi-core cable is present, the measured core-specific reflected signal and the baseline data of the multi-core cable, extracting, from time-series data for the measured core-specific reflected signal, only core-specific partial time-series data having a difference between the measured core-specific reflected signal and the baseline data of the multi-core cable, transforming only the core-specific partial time-series data having the difference into a core-specific time-frequency distribution, and extracting faulty-core determination data based on the transformed core-specific partial time-series data;
classifying a fault core from the multi-core cable by inputting the extracted faulty-core determination data to a neural network;
based on a determination that the baseline data of the multi-core cable is present:
arranging core-specific time-frequency distributions of the core-specific partial time-series data having the difference as one image and then normalizing the image on a basis of a core-specific time-frequency distribution having a maximum value among the core-specific time-frequency distributions arranged as one image; and
performing max-pooling on the normalized image to extract the faulty-core determination data.

9. The multi-core cable fault classification method of claim 8, wherein the baseline data of the multi-core cable is data regarding a reflected signal measured when no fault exists in the multi-core cable.

10. The multi-core cable fault classification method of claim 8, further comprising, based on a determination that the baseline data of the multi-core cable is not present:
compensating for the measured core-specific reflected signal on a basis of experimental data of the multi-core cable;
extracting core-specific partial time-series data corresponding to the reflected signal for which compensation is made and transforming the core-specific partial time-series data into a core-specific time-frequency distribution;
normalizing the core-specific time-frequency distribution; and
correcting a distortion of the normalized core-specific time-frequency distribution.

11. The multi-core cable fault classification method of claim 10, wherein the compensation of the measured core-specific reflected signal comprises compensating for the measured core-specific reflected signal on the basis of experimental data using a signal distortion degree calculation formula expressed in Equation 1 below:

$$\zeta(t) = \frac{|H(S_r(t))|}{|H(S_o(t))|} \quad \text{[Equation 1]}$$

where $\zeta(t)$ is an attenuation rate in time series, H is a Hilbert transform value, r is a reflected signal value, o is a reference signal value, $S_r(t)$ is a reflected signal in time series, $S_o(t)$ is a reference signal in a time series, $H(S_r(t))$ is a Hilbert transform of the reflected signal, and $H(S_o(t))$ is a Hilbert transform value of the reference signal.

12. The multi-core cable fault classification method of claim 10, wherein the distortion correction of the distortion of the normalized core-specific time-frequency distribution comprises:
applying a column shift to the normalized core-specific time-frequency distribution to move the core-specific time-frequency distribution;
estimating a slope of the moved core-specific time-frequency distribution through principal component analysis (PCA) and rotating the core-specific time-frequency distribution on a basis of the estimated slope;
extracting core-specific contours from the rotated core-specific time-frequency distribution;
merging the extracted core-specific contours into one image; and extracting faulty-core determination data from information regarding at least one of a point, a line, and an area in which the core-specific contours overlap each other through the image.

13. The multi-core cable fault classification method of claim 12, wherein the estimation of the slope of the moved core-specific time-frequency distribution comprises rotating the moved core-specific time-frequency distribution using a rotation angle calculation formula expressed in Equation 2 below:

$$\theta_i = \frac{\pi}{N}(i-1) \qquad \text{[Equation 2]}$$

where $\theta_i$ is an angle by which an $i^{th}$ core is rotated, N is the number of cores in the multi-core cable, and i is a core number of a core that is rotated.

14. The multi-core cable fault classification method of claim 12, wherein the extraction of the core-specific contours from the rotated core-specific time-frequency distribution comprises extracting a contour from the rotated core-specific time-frequency distribution using a contour extraction formula expressed in Equation 3 below:

$$I_{new}(m,n) = e^{-a|I_{old}(m,n) - \sigma|} \qquad \text{[Equation 3]}$$

where $I_{new}(m, n)$ is a new image (a contour image), $I_{old}(m, n)$ is an old image (an image before a contour is extracted), m and n are a row number and a column number in a time-frequency distribution image, a is a parameter value for determining a thickness of a contour, and $\sigma$ is a parameter value for determining an area of an ellipse.

* * * * *